(12) United States Patent
Yamano

(10) Patent No.: US 7,732,712 B2
(45) Date of Patent: Jun. 8, 2010

(54) WIRING BOARD AND METHOD FOR MANUFACTURING THE SAME

(75) Inventor: Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 982 days.

(21) Appl. No.: 11/421,607

(22) Filed: Jun. 1, 2006

(65) Prior Publication Data

US 2006/0272854 A1    Dec. 7, 2006

(30) Foreign Application Priority Data

Jun. 2, 2005    (JP)    ............................. 2005-162547

(51) Int. Cl.
 *H05K 1/16*    (2006.01)
(52) U.S. Cl. .......................... 174/260; 361/761; 29/832
(58) Field of Classification Search ......... 361/761–764; 174/260; 29/832–841
See application file for complete search history.

(56) References Cited

U.S. PATENT DOCUMENTS

| 4,979,076 A | * | 12/1990 | DiBugnara | ................... 361/764 |
| 6,239,976 B1 | * | 5/2001 | Templeton et al. | .......... 361/737 |
| 7,420,128 B2 | * | 9/2008 | Sunohara et al. | ............ 174/260 |

FOREIGN PATENT DOCUMENTS

| JP | 2001-352007 | 12/2001 |
| JP | 2002-076637 | 3/2002 |
| JP | 2003-142628 | 5/2003 |
| JP | 2004-327624 | 11/2004 |
| JP | 2004-343021 | 12/2004 |
| WO | 2005/004567 | 1/2005 |

\* cited by examiner

*Primary Examiner*—Jeremy C Norris
(74) *Attorney, Agent, or Firm*—Rankin, Hill & Clark LLP

(57) ABSTRACT

A wiring board includes: a semiconductor chip; an insulating layer in which the semiconductor chip is embedded; a wiring connected to the semiconductor chip; and reinforcing layers for reinforcing the insulating layer, the reinforcing layers respectively formed on a front face side of the insulating layer and a rear face side of the insulating layer.

12 Claims, 29 Drawing Sheets

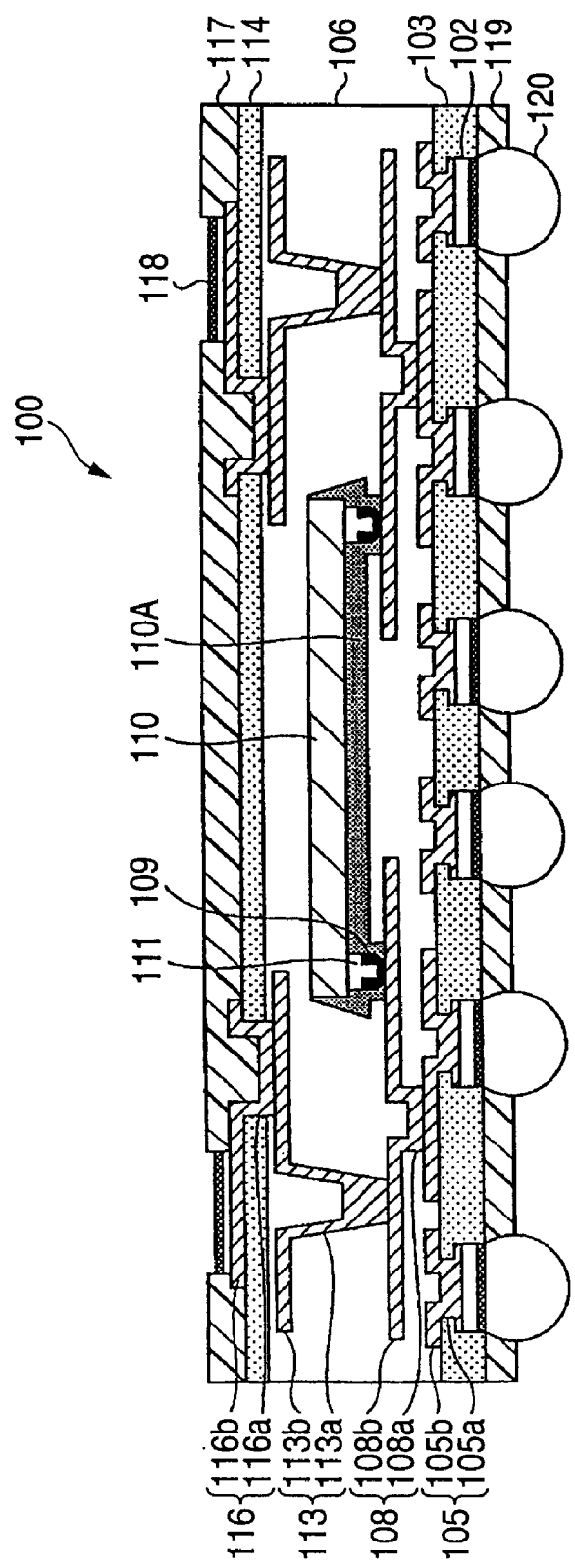

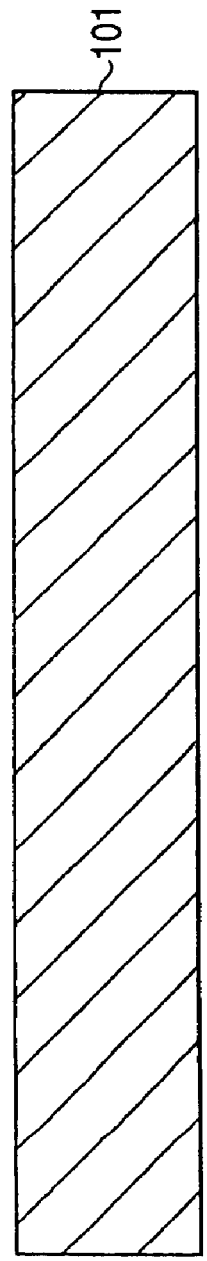
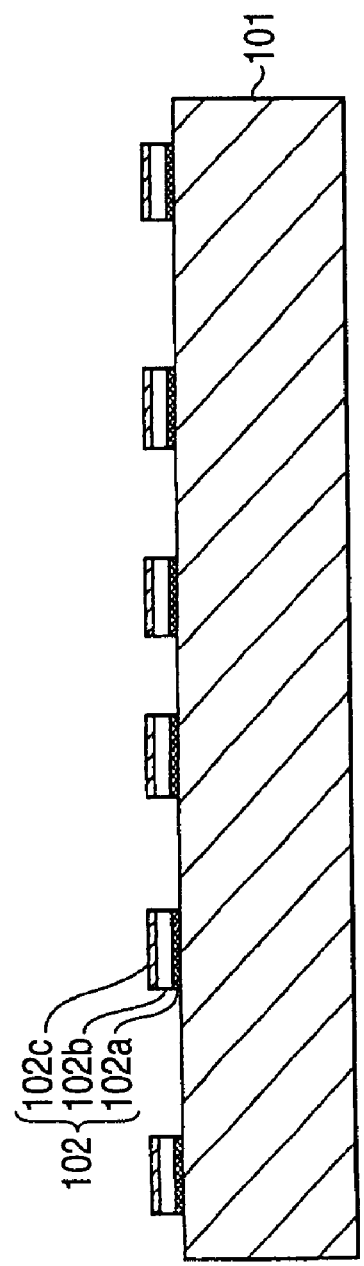
FIG. 2A
FIG. 2B

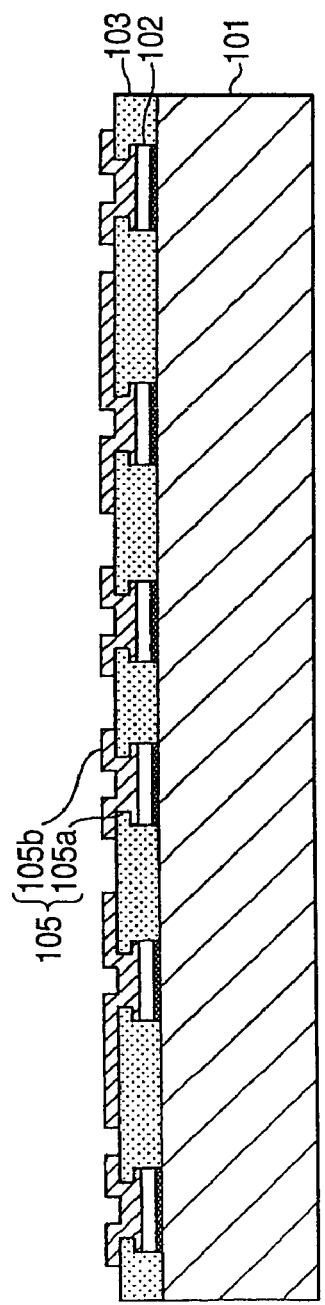
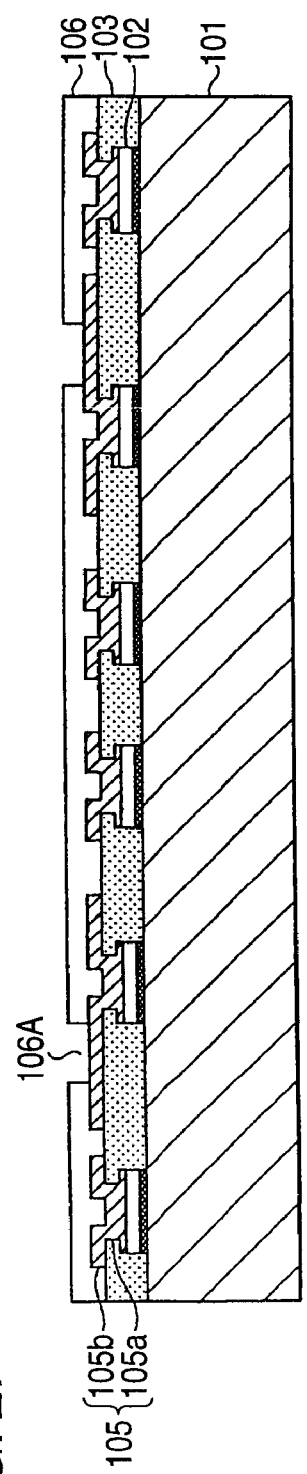

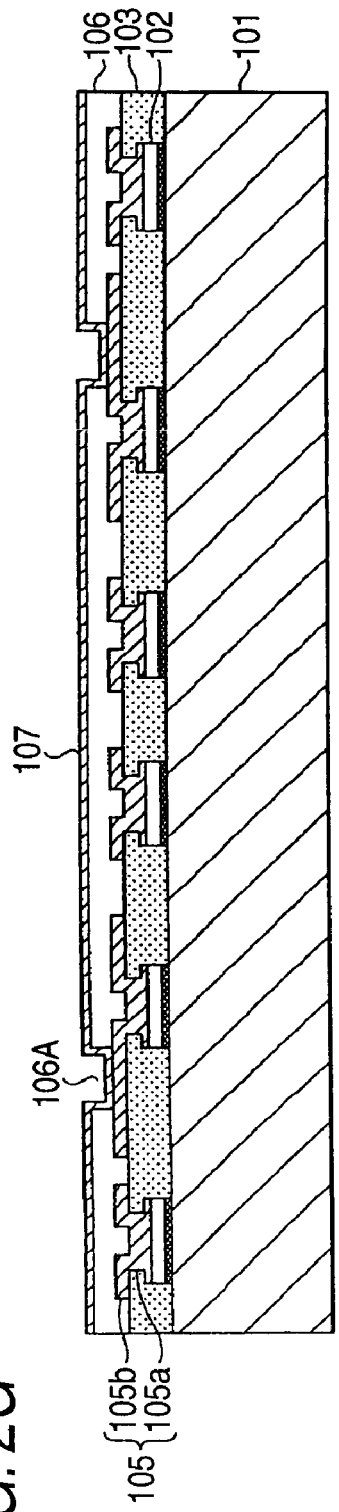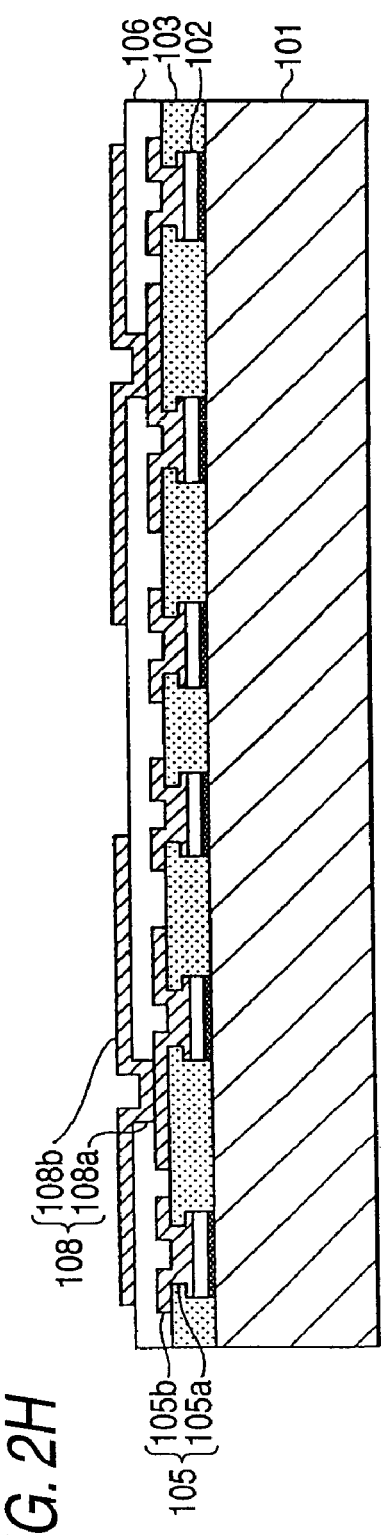

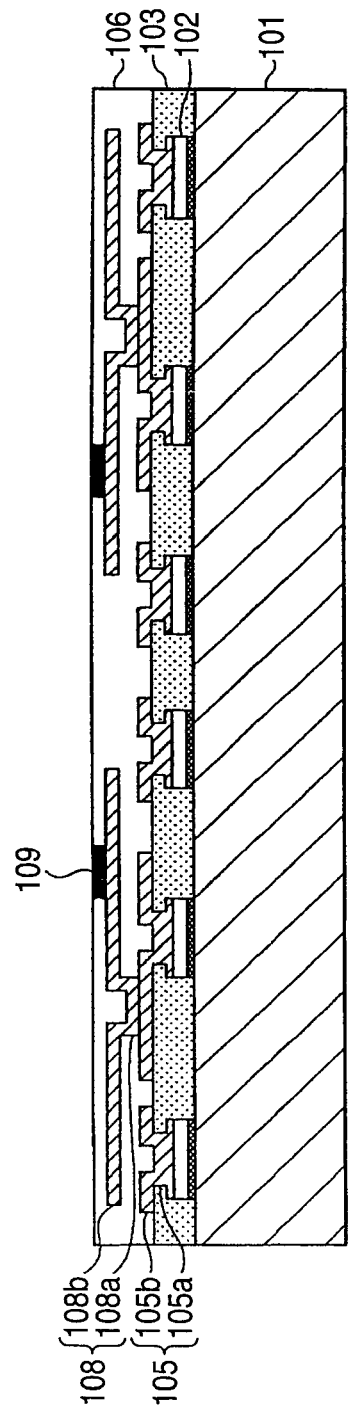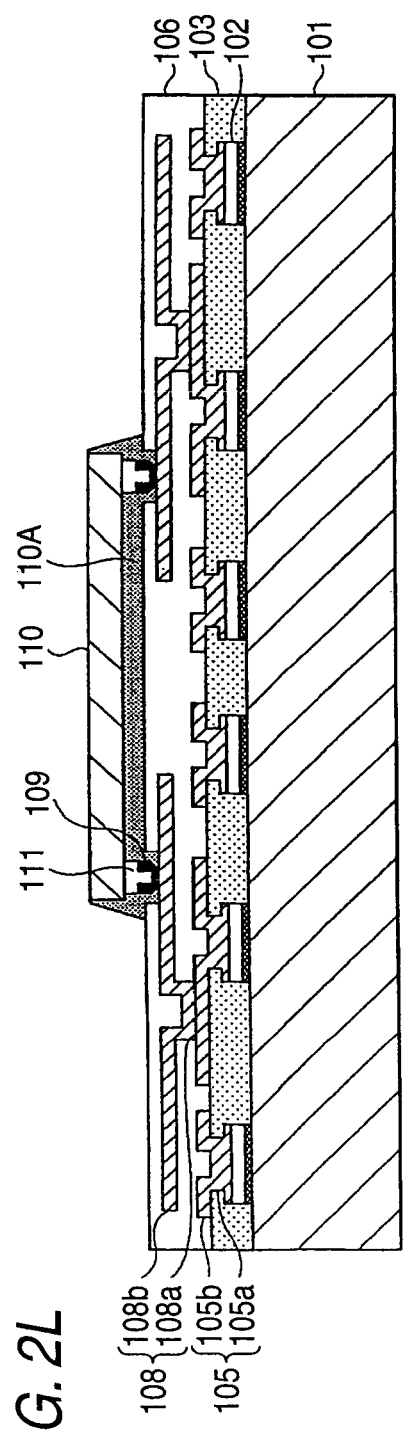

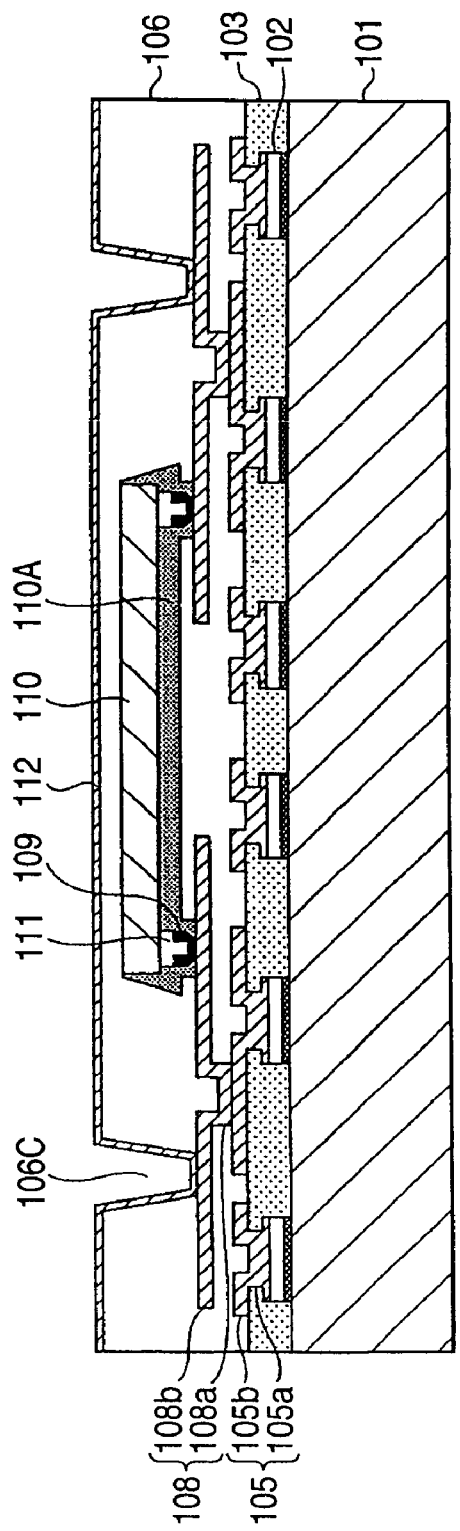

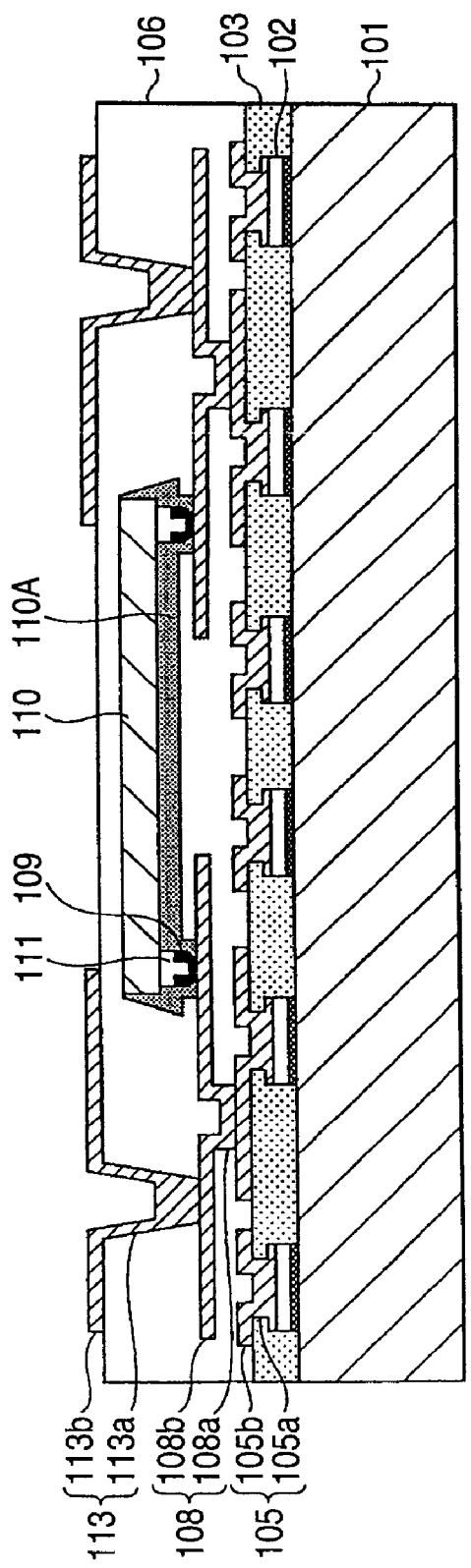

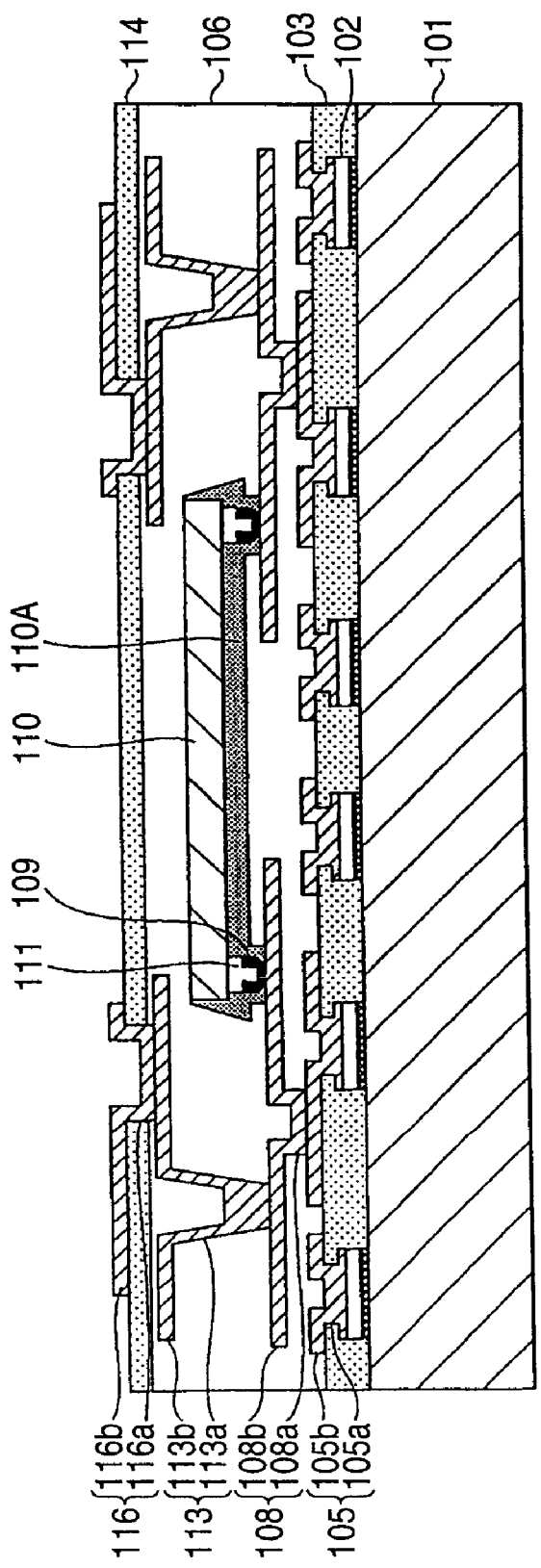

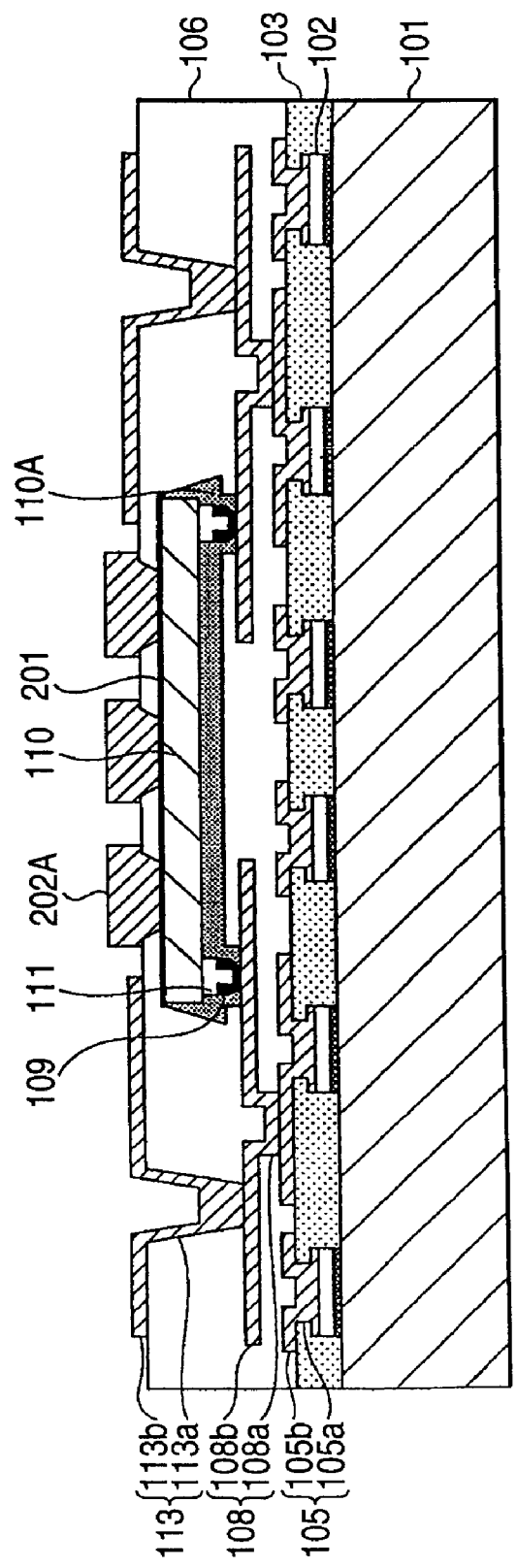

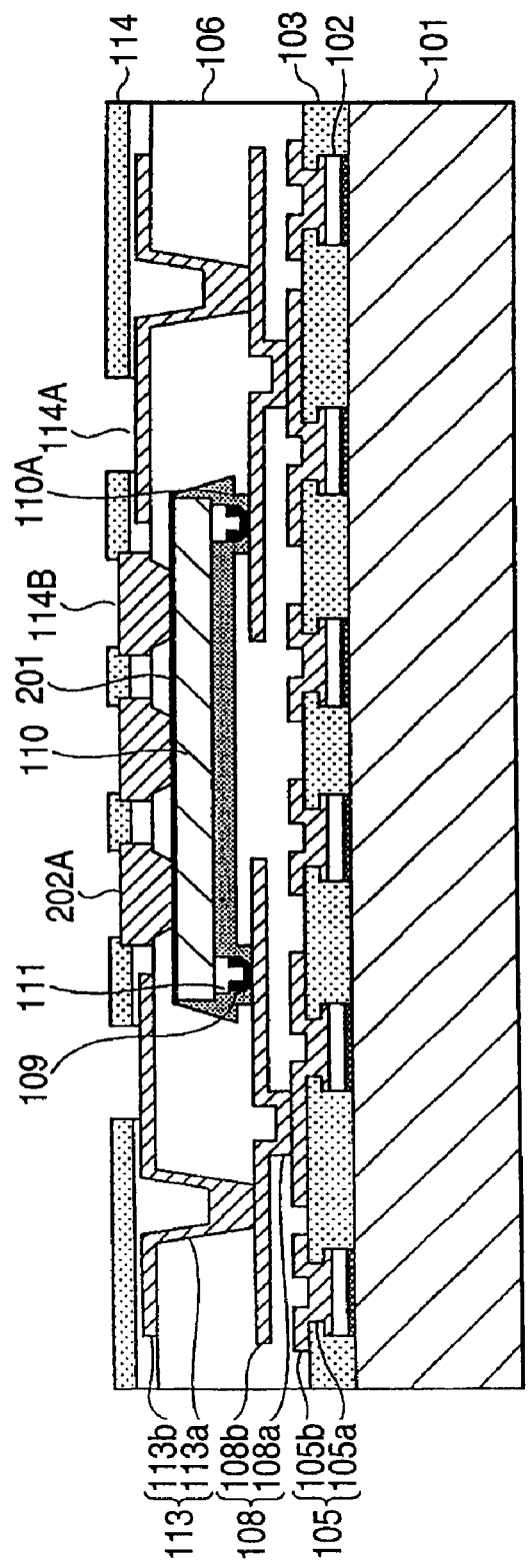

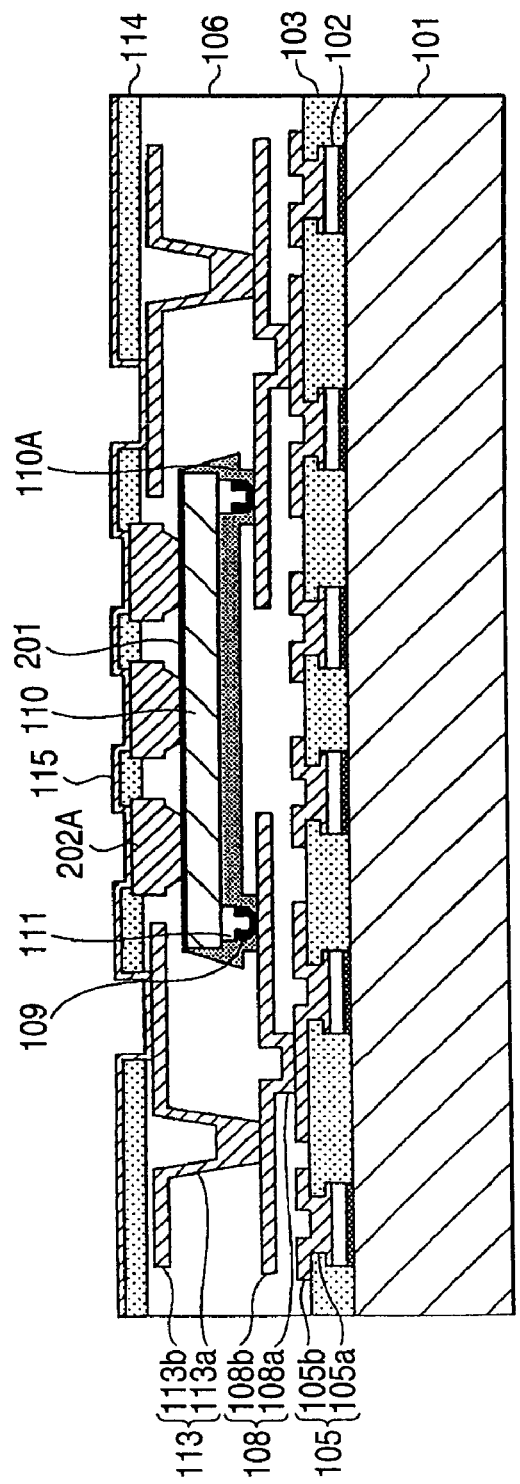

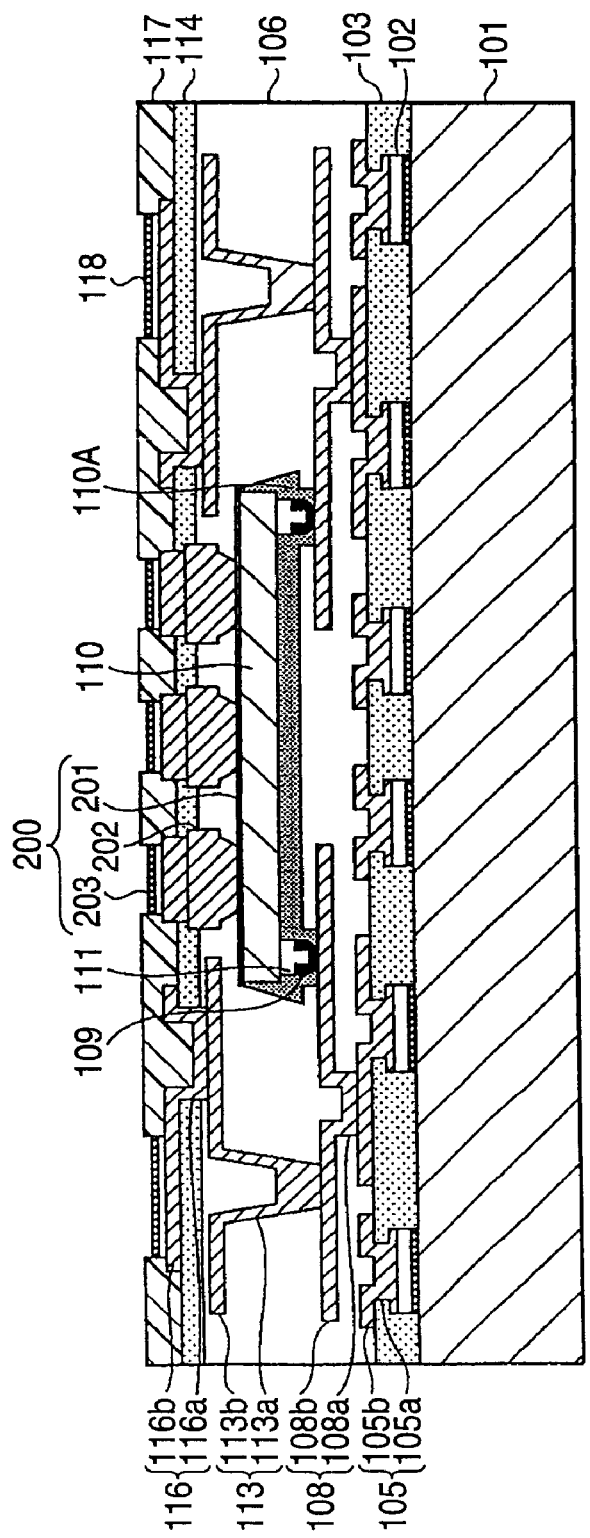

WIRING BOARD AND METHOD FOR MANUFACTURING THE SAME

This application claims foreign priority based on Japanese Patent application No. 2005-162547, filed Jun. 2, 2005, the content of which is incorporated herein by reference in its entirety.

BACKGROUND OF THE INVENTION

1. Field of the Invention

The present invention relates to a wiring board and a method for manufacturing the wiring board, and more particularly to a wiring board incorporating a semiconductor chip and a method for manufacturing the wiring board.

2. Description of the Related Art

Nowadays, performances of electronic devices using semiconductor devices such as semiconductor chips have been progressively improved. A high density when the semiconductor chips are mounted on a board, the miniaturization of the board when the semiconductor chips are mounted and a saved space have been required.

Accordingly, a board in which semiconductor chips are embedded, what is called a chip-incorporated wiring board has been proposed and various structures for incorporating the semiconductor chips in the board have been proposed. The above-described chip-incorporated wiring board has a wiring connected to the semiconductor chips, and connecting sections are formed so that the wiring board is connected to other devices or a mother board or the like. (For example, refer to JP-A-2004-327624, JP-A-2001-352007 and JP-A-2003-142628.)

However, when the small thickness and the high density of the chip incorporated wiring board are to be realized, a problem of warpage of the wiring board sometimes arises. In order to deal with the warpage, for instance, a board having a prescribed thickness such as a core board needs to be laminated on a layer in which the semiconductor chips are embedded so as to suppress the warpage. However, in such a laminated structure, a problem arises that the small thickness and the high density of the wiring board are hardly realized.

In recent years, since the semiconductor chips operating at high speed have a large quantity of heat generation, there is a problem that the wiring board in which the semiconductor chips are incorporated may possibly generate a warpage owing to the heat generation.

As described above, it is difficult to reduce the thickness of the wiring board, while the warpage of the wiring board is suppressed. Especially, when the quantity of generated heat of the semiconductor chips is large, it is more difficult to reduce the warpage.

SUMMARY OF THE INVENTION

The present invention has been made in view of the above circumstances, and provides a new and useful wiring board and a method for manufacturing the wiring board.

In embodiments of the present invention, a small thickness of a wiring board is realized in which semiconductor chips are incorporated, and the warpage of the wiring board is suppressed.

In some implementations, a wiring board of the invention comprises:

a semiconductor chip;

an insulating layer in which the semiconductor chip is embedded;

a wiring connected to the semiconductor chip; and reinforcing layers for reinforcing the insulating layer, the reinforcing layers respectively formed on a front face side of the insulating layer and a rear face side of the insulating layer.

According to the present invention, the small thickness of the wiring board in which the semiconductor chip is incorporated can be realized and the warpage of the wiring board can be suppressed.

Further, when the reinforcing layers are made of prepreg material, the reinforcing layers are easily formed and the rigidity of the reinforcing layers are preferably high.

In the wiring board of the invention, one reinforcing layer of the reinforcing layers which is formed on the rear face side of the insulting layer has an opening portion, and an electrode to be connected to the wiring is formed in the opening portion.

Accordingly, electrical connection to the semiconductor chip is easily realized on the rear face side.

In the wiring board of the invention, an electrode to be connected to the wiring is formed above other reinforcing layer of the reinforcing layers that is formed on the front face side of the insulting layer.

Accordingly, electrical connection to the semiconductor chip is easily realized on the front face side.

The wiring board of the invention further comprises:

an additional reinforcing layer for reinforcing the insulating layer, the additional reinforcing layer being embedded in the insulating layer.

Accordingly, rigidity of the wiring board is further improved.

The wiring board of the invention further comprises:

a heat radiating section for radiating heat of the semiconductor chip.

Accordingly, the heat radiation of the semiconductor chip can be realized.

In the wiring board of the invention, the heat radiating section includes a metal layer formed on the semiconductor chip and a heat radiating via-plug connected to the metal layer.

Accordingly, the heat of the semiconductor chip can be efficiently radiated.

In some implementations, a method of the invention for manufacturing a wiring board comprises:

forming a first reinforcing layer on a supporting board, the first reinforcing layer reinforcing an insulating layer;

forming the insulating layer and a wiring on the first reinforcing layer, a semiconductor chip being embedded in the insulating layer and the wiring being connected to the semiconductor chip;

forming a second reinforcing layer on the insulating layer, the second reinforcing layer reinforcing the insulating layer; and removing the supporting board.

According to the present invention, the small thickness of the wiring board in which the semiconductor chip is incorporated can be realized and the warpage of the wiring board can be suppressed.

The method of the invention for manufacturing the wiring board further comprises:

forming a third reinforcing layer to be embedded in the insulating layer, the third reinforcing layer reinforcing the insulating layer.

Accordingly, the rigidity of the wiring board is more improved.

The method of the invention for manufacturing the wiring board further comprises:

forming a heat radiating section on the semiconductor chip, the heat radiating section radiating heat of the semiconductor chip.

Accordingly, the heat radiation of the semiconductor chip can be realized.

In the method of the invention for manufacturing the wiring board, the first reinforcing layer is formed thicker than the second reinforcing layer.

Accordingly, the warpage of the wiring board can be efficiently suppressed.

According to the present invention, the small thickness of the wiring board in which the semiconductor chip is incorporated can be realized and warpage of the wiring board can be efficiently suppressed.

BRIEF DESCRIPTION OF THE DRAWINGS

FIG. 1 is a diagram showing a wiring board according to a first embodiment.

FIG. 2A is a diagram showing a method for manufacturing the wiring board shown in FIG. 1 in accordance with a procedure (No. 1).

FIG. 2B is a diagram showing the method for manufacturing the wiring board shown in FIG. 1 in accordance with the procedure (No. 2).

FIG. 2E is a diagram showing a method for manufacturing the wiring board shown in FIG. 1 in accordance with a procedure (No. 5).

FIG. 2F is a diagram showing the method for manufacturing the wiring board shown in FIG. 1 in accordance with the procedure (No. 6).

FIG. 2G is a diagram showing the method for manufacturing the wiring board shown in FIG. 1 in accordance with the procedure (No. 7).

FIG. 2H is a diagram showing a method for manufacturing the wiring board shown in FIG. 1 in accordance with the procedure (No. 8).

FIG. 2K is a diagram showing a method for manufacturing the wiring board shown in FIG. 1 in accordance with the procedure (No. 11).

FIG. 2L is a diagram showing a method for manufacturing the wiring board shown in FIG. 1 in accordance with a procedure (No. 12).

FIG. 2N is a diagram showing the method for manufacturing the wiring board shown in FIG. 1 in accordance with the procedure (No. 14).

FIG. 2O is a diagram showing a method for manufacturing the wiring board shown in FIG. 1 in accordance with the procedure (No. 15).

FIG. 2R is a diagram showing a method for manufacturing the wiring board shown in FIG. 1 in accordance with the procedure (No. 18).

FIG. 5C is a diagram showing the method for manufacturing the wiring board shown in FIG. 4 in accordance with the procedure (No. 3).

FIG. 5D is a diagram showing a method for manufacturing the wiring board shown in FIG. 4 in accordance with the procedure (No. 4).

FIG. 5E is a diagram showing a method for manufacturing the wiring board shown in FIG. 4 in accordance with a procedure (No. 5).

FIG. 5H is a diagram showing a method for manufacturing the wiring board shown in FIG. 4 in accordance with the procedure (No. 8).

DESCRIPTION OF THE PREFERRED EMBODIMENTS

Figure 2C:
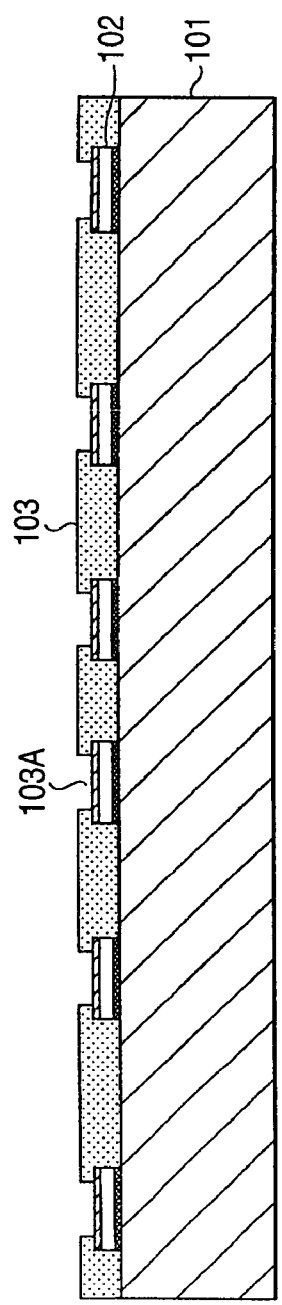
FIG. 2C is a diagram showing the method for manufacturing the wiring board shown in FIG. 1 in accordance with the procedure (No. 3).

A wiring board according embodiments of the present invention is a wiring board in which a semiconductor chip is incorporated. The wiring board includes: a semiconductor chip; an insulating layer in which the semiconductor chip is embedded; a wiring connected to the semiconductor chip; and reinforcing layers for reinforcing the insulating layer, the reinforcing layers respectively formed on a front face side of the insulating layer and a rear face side of the insulating layer.

Accordingly, the wiring board can be constructed that is less in warpage of the wiring board, high in its flatness and can meet a finely configured wiring. Further, the reinforcing layers can be met by a partial replacement of the layer of a usual build-up layer (the insulating layer), so that a usual build-up method can be applied to the reinforcing layers. Therefore, the wiring board is easily formed with high reliability and the small thickness can be realized.

Now, embodiments of the present invention will be described below by referring to the drawings.

First Embodiment

FIG. 1 is a sectional view schematically showing a wiring board 100 according to a first embodiment of the present invention. With reference to FIG. 1, the wiring board according to the present invention has an insulating layer 106 having a semiconductor chip 110 embedded and made of what is called a build-up resin material such as an epoxy. Reinforcing layers 103 and 114 for reinforcing the insulating layer 106 are respectively formed so as to come into contact with both the surfaces of the insulating layer 106.

The semiconductor chip 110 is connected to a wiring section (described below) and connected through the wiring section to an electrode 102 formed in the side of the reinforcing layer 103 (a lower side in the drawing, hereinafter) or an electrode 118 formed in the side of the reinforcing layer 114 (an upper side in the drawing, hereinafter). For instance, the electrode 102 or the electrode 118 is connected to a mother board or other devices, or connecting devices.

In an electrode pad (not shown in the drawing) of the semiconductor chip 110, stud bumps 111 made of, for instance, Au are formed. The stud bump 111 is connected to a wiring section 108 embedded in the insulating layer 106 through, for instance, a solder connecting section 109. Further, in the lower side of the semiconductor chip 110, an under-fill layer 110A may be formed.

In the wiring board 100 according to this embodiment, a wiring section 105, a wiring section 113 and a wiring section 116 are formed with, for instance, Cu so as to be laminated in addition to the wiring section 108.

The wiring section 105 includes a via-plug 105a and a pattern wiring 105b. The via-plug 105a is formed in an opening portion formed in the reinforcing layer 103. On the reinforcing layer 103, the pattern wiring 105b connected to the via-plug 105a is formed.

On the wiring section 105, the wiring section 108 connected to the wiring section 105 is formed and embedded in the insulating layer 106.

The wiring section 108 includes a via-plug 108a formed on the pattern wiring 105b and a pattern wiring 108b connected to the via-plug 108a. To the pattern wiring 108b, the semiconductor chip 110 is connected through the solder connecting section 109 and the stud bump 111 as described above.

Further, on the wiring section 108, the wiring section 113 connected to the wiring section 108 is embedded and formed in the insulating section 106. The wiring section 113 includes a via-plug 113a formed on the pattern wiring 108b and a pattern wiring 113b connected to the via-plug 113a.

Further, on the wiring section 113, the wiring section 116 connected to the wiring section 113 is formed. The wiring section 116 includes a via-plug 116a formed on the pattern wiring 113b and a pattern wiring 116b connected to the via plug 116a.

The via-plug 116a is formed in an opening portion formed from the insulating layer 106 side to the reinforcing layer 114 and the pattern wiring 116b is formed on the reinforcing layer 114.

In an opening portion of the reinforcing layer 103, the electrode 102 connected to the via-plug 105a is formed. On the pattern wiring 116b, the electrode 118 is formed respectively. Thus, objects to be connected are easily electrically connected to the semiconductor chip in the lower side and the upper side, respectively.

Further, solder resist layers 119 and 117 are respectively formed so as to cover the reinforcing layer 103 and the reinforcing layer 114 therewith. On the solder resist layers, opening portions for exposing the electrodes are formed.

Further, for instance, a solder ball 120 is formed in the electrode 102 as required. A solder ball may be formed in the electrode 118.

In the wiring board 100 of this embodiment, the insulating layer 106 in which the semiconductor chip or the wiring sections are embedded is formed so as to be sandwiched in between the reinforcing layer 103 and the reinforcing layer 114. Therefore, the wiring board can be formed in which the warpage of the wiring board having the semiconductor chip incorporated is reduced and that is high in its flatness and can meet a finely formed wiring.

For instance, the reinforcing layers 103 and 114 are preferably formed by using a prepreg material. The prepreg material is referred to as an organic core material, or sometimes simply referred to as a core material, and may be used as a material of a core board when a multi-layer wiring board (a build-up board) is formed.

For instance, the prepreg material has a structure that an epoxy type resin material is impregnated with glass fibers and solidified, and shows a feature that rigidity is higher than that of an ordinary build-up resin material. For instance, a modulus of elasticity (Young's modulus) of the build-up resin material is about 5 GPa to 8 GPa. As compared therewith, the modulus of elasticity of the prepreg material is 20 GPa or more and the prepreg material has high rigidity. Consequently, the warpage of the wiring board is be reduced.

The material with which the reinforcing layers 103 and 114 are formed is not limited to the prepreg material, and, for instance, a mold resin having high rigidity may be employed. Further, as a material forming the reinforcing layers 103 and 114, a material such as metal may be used. When an electric conductive material such as metal is used, a structure for insulating the wiring section from the reinforcing layer is preferably added.

Further, the wiring board according to this embodiment can be formed in accordance with the usual build-up method and the thickness of the wiring board can be reduced.

Now, a method for manufacturing the wiring board will be described in accordance with a procedure by using FIGS. 2A to 2V.

Firstly, in a process shown in FIG. 2A, a supporting board 101 is prepared that is made of an electric conductive material, for instance, Cu and has the thickness of 200 μm.

Then, in a process shown in FIG. 2B, a resist pattern (not shown in the drawing) is formed on the supporting board 101 by a photolithography method and the electrode 102 is formed having a structure that for instance, an Au layer 102a, an Ni layer 102b and a Cu layer 102c are laminated by an electrolytic plating with the resist pattern used as a mask. In the electrolytic plating, since the supporting board 101 serves as a path through which an electric current is supplied, the supporting board 101 is preferably made of the electric conductive material, and more preferably made of a material having a low resistance, such as Cu.

Then, in a process shown in FIG. 2C, the reinforcing layer 103 made of the prepreg material is formed on the supporting board 101 so as to cover the electrode 102 therewith. After the reinforcing layer 103 is formed, a via-hole 103A is formed by, for instance, a laser so as to expose the electrode 102.

Figure 2D:
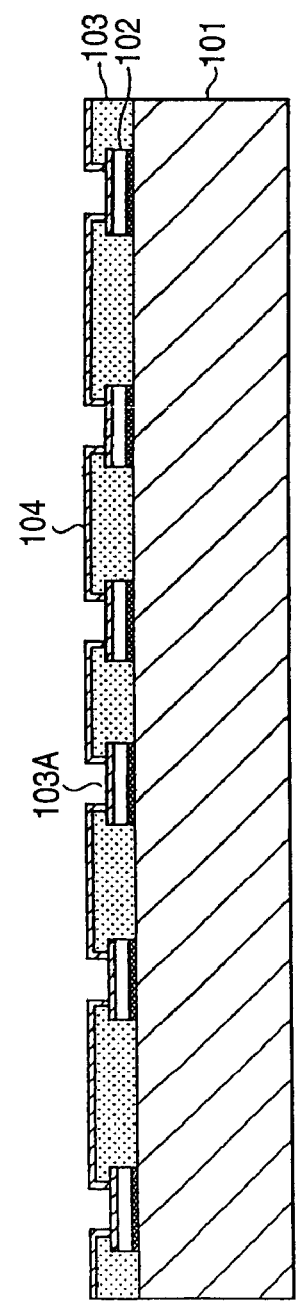
FIG. 2D is a diagram showing a method for manufacturing the wiring board shown in FIG. 1 in accordance with the procedure (No. 4).

In a process shown in FIG. 2D, a desmear process is carried out as required to remove residue materials of the via-hole and perform a surface treatment of the reinforcing layer 103, and then, a seed layer 104 of Cu is formed on the surface of the reinforcing layer 103 and the surface of the electrode 102 by an electroless plating process.

Then, in a process shown in FIG. 2E, a resist pattern (not shown in the drawing) is formed by the photolithography method. Then, the via-plug 105a is formed in the via-hole 103A and the pattern wiring 105b connected to the via-plug 105a is formed on the reinforcing layer 103 by the electrolytic plating of Cu using the resist pattern as a mask to form the wiring section 105.

After the wiring section 105 is formed, the resist pattern is separated to remove an exposed surplus seed layer by etching.

Then, in a process shown in FIG. 2F, the insulating layer 106 (a build-up layer) made of, for instance, a thermosetting epoxy resin is formed on the reinforcing layer 103 so as to cover the wiring section 105 therewith. Further, in the insulating layer, a via-hole 106A is formed by a laser so that a part of the pattern wiring 105b is exposed.

Subsequently, in a process shown in FIG. 2G, a desmear process is carried out as required in the same manner as that of the process shown in FIG. 2D to remove residue materials of the via-hole and perform a surface treatment of the insulating layer 106, and then, a seed layer 107 of Cu is formed on the surface of the insulating layer 106 and the exposed surface of the pattern wiring 105b by the electroless plating process.

Then, in a process shown in FIG. 2H, a resist pattern (not shown in the drawing) is formed by the photolithography method in the same manner as that of the process shown in FIG. 2E. Then, the via-plug 108a is formed in the via-hole 106A and the pattern wiring 108b connected to the via-plug 108a is formed on the insulating layer 106 by the electrolytic plating of Cu using the resist pattern as a mask to form the wiring section 108.

After the wiring section 108 is formed, the resist pattern is peeled from the seed layer to remove an exposed surplus seed layer by etching.

Figure 2I:
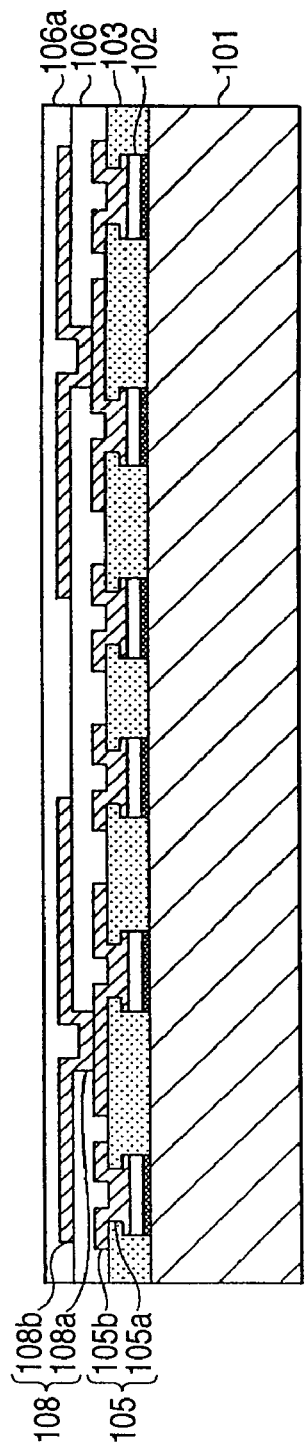
FIG. 2I is a diagram showing the method for manufacturing the wiring board shown in FIG. 1 in accordance with the procedure (No. 9).

Then, in a process shown in FIG. 2I, an insulating layer (a build-up layer) 106a made of, for instance, a thermosetting epoxy resin is formed on the insulating layer 106 so as to cover the wiring section 108 therewith. Since the insulating layer 106a is substantially entirely formed integrally with the insulating layer 106, the insulating layer 106 is referred to as a layer including the insulating layer 106a after FIG. 2I.

Figure 2J:
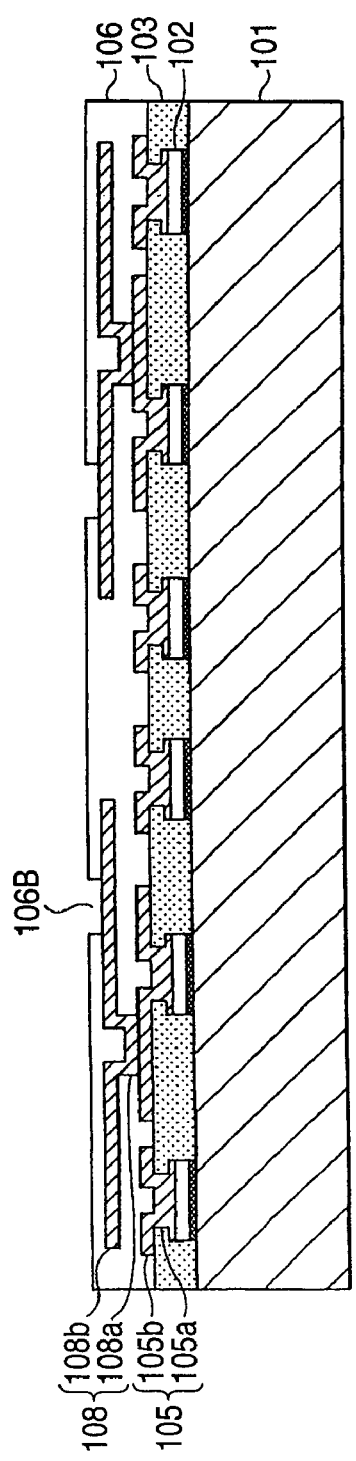
FIG. 2J is a diagram showing the method for manufacturing the wiring board shown in FIG. 1 in accordance with the procedure (No. 10).

Subsequently, in a process shown in FIG. 2J, an opening portion 106B is formed on the insulating layer 106 by, for instance, a laser so as to expose a part of the pattern wiring 108b.

Then, in a process shown in FIG. 2K, a desmear process is carried out as required to remove the residue materials of the opening portion and perform the surface treatment of the insulating layer 106, and then, the solder connecting section 109 is formed in the opening portion 106B by, for instance, the electrolytic plating process.

Then, in a process shown in FIG. 2L, the semiconductor chip 110 having the stud bump 111 made of, for instance, Au is mounted on the wiring section 108 so that the stud bump 111 corresponds to the solder connecting section 109. In this case, a re-flow process of the solder connecting section 109 is preferably carried out if necessary to satisfactorily achieve the electric connection of the solder connecting section 109 to the stud bump 111. Further, the under-fill layer 110A is preferably formed between the semiconductor chip 110 and the insulating layer 106 as required.

Figure 2M:
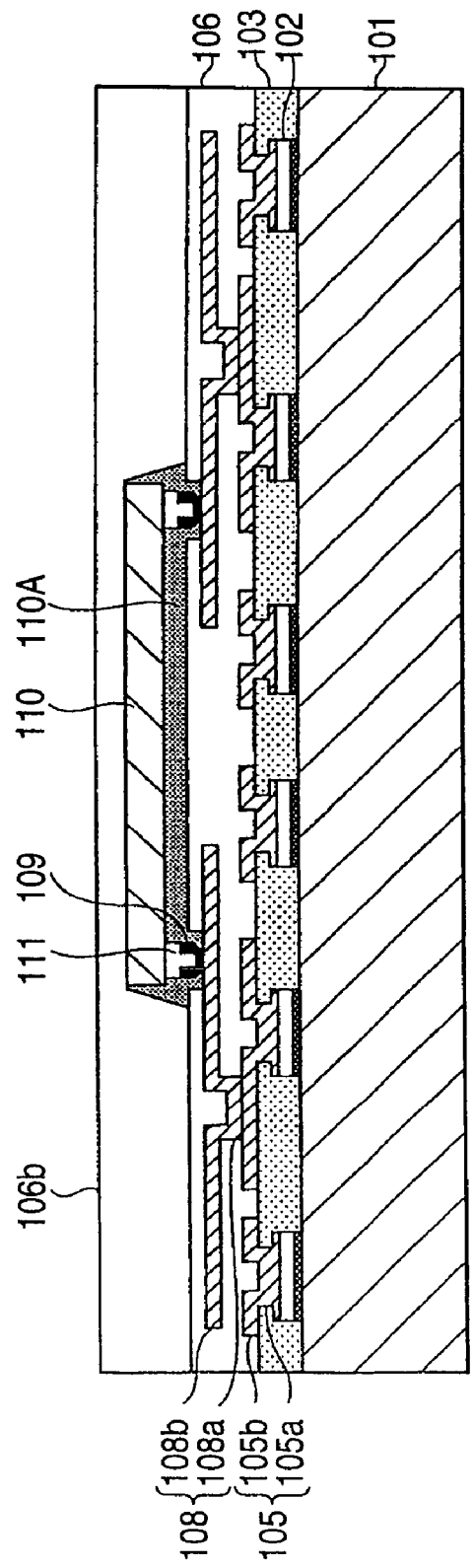
FIG. 2M is a diagram showing the method for manufacturing the wiring board shown in FIG. 1 in accordance with the procedure (No. 13).

Then, in a process shown in FIG. 2M, an insulating layer (a build-up layer) 106b made of, for instance, a thermosetting epoxy resin is formed on the insulating layer 106 so as to cover the semiconductor chip 110 therewith. Since the insulating layer 106b is substantially entirely formed integrally with the insulating layer 106, the insulating layer 106 is referred to as a layer including the insulating layer 106b after FIG. 2M.

Subsequently, in a process shown in FIG. 2N, a via-hole 106C is formed on the insulating layer 106 by, for instance, a laser so as to expose a part of the pattern wiring 108b.

Then, a desmear process is carried out as required to remove the residue materials of the via-hole and perform the surface treatment of the insulating layer 106, and then, a seed layer 112 of Cu is formed on the surface of the insulating layer 106 and the surface of the pattern wiring 108b by the electroless plating process.

In a process shown in FIG. 2O, a resist pattern (not shown in the drawing) is formed by the photolithography method in the same manner as that of the process shown in FIG. 2H. Then, the via-plug 113a is formed in the via-hole 106C and the pattern wiring 113b connected to the via-plug 113a is formed on the insulating layer 106 by the electrolytic plating of Cu using the resist pattern as a mask to form the wiring section 113.

After the wiring section 113 is formed, the resist pattern is peeled from the seed layer to remove an exposed surplus seed layer by etching.

Figure 2P:
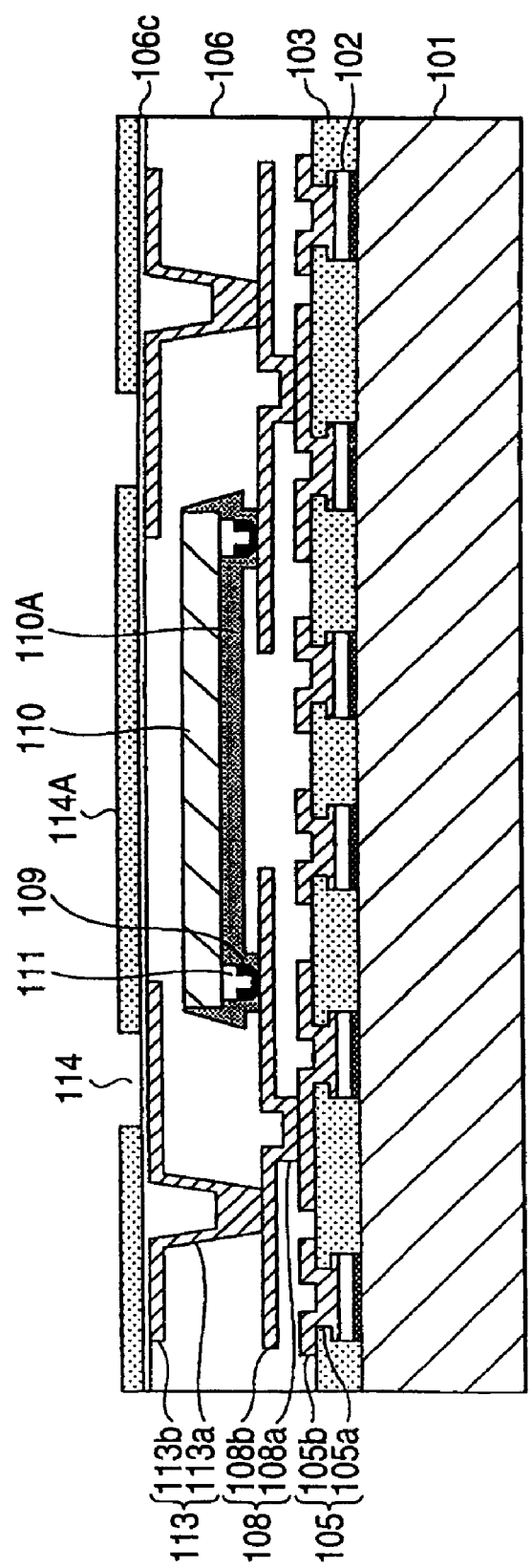
FIG. 2P is a diagram showing the method for manufacturing the wiring board shown in FIG. 1 in accordance with the procedure (No. 16).

Then, in a process shown in FIG. 2P, an insulating layer (a build-up layer) 106c made of, for instance, a thermosetting epoxy resin is formed on the insulating layer 106 so as to cover the wiring section 113 therewith. Since the insulating layer 106c is substantially entirely formed integrally with the insulating layer 106, the insulating layer 106 is referred to as a layer including the insulating layer 106c after FIG. 2P.

Further, the reinforcing layer 114 made of, for instance, the prepreg material is formed on the insulating layer 106c. After the reinforcing layer 114 is formed, via-holes 114A are formed in the reinforcing layer 114 and the insulating layer 106 by, for instance, a laser so as to expose the pattern wiring 113b.

Figure 2Q:
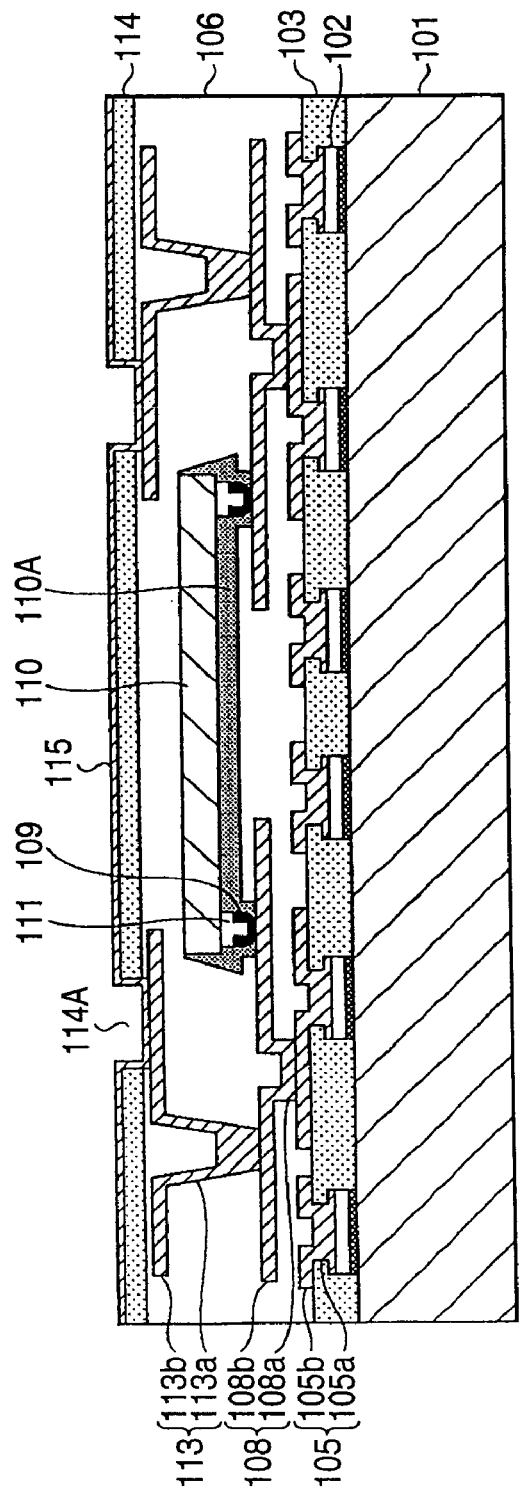
FIG. 2Q is a diagram showing the method for manufacturing the wiring board shown in FIG. 1 in accordance with the procedure (No. 17).

Then, in a process shown in FIG. 2Q, a desmear process is carried out as required to remove the residue materials of the via-holes and perform the surface treatments of the insulating layer 106 and the reinforcing layer 114, and then, a seed layer 115 of Cu is formed on the inner wall surfaces of the via-holes, the surface of the reinforcing layer 114, and the surface of the pattern wiring 113b by the electroless plating process.

Then, in a process shown in FIG. 2R, a resist pattern (not shown in the drawing) is formed by the photolithography method in the same manner as that of the process shown in FIG. 2O. Then, the via-plug 116a is formed in the via-hole 114A and the pattern wiring 116b connected to the via-plug 116a is formed on the reinforcing layer 114 by the electrolytic plating of Cu using the resist pattern as a mask to form the wiring section 116.

After the wiring section 116 is formed, the resist pattern is peeled from the seed layer to remove an exposed surplus seed layer by etching.

Figure 2S:
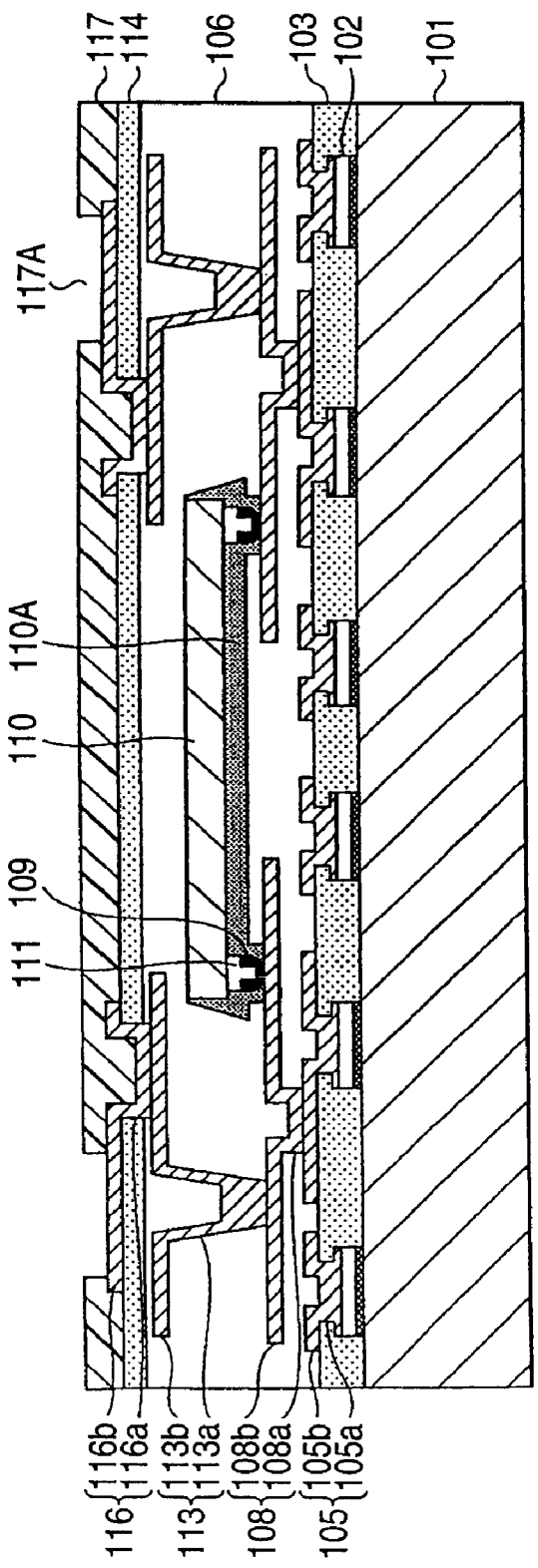
FIG. 2S is a diagram showing a method for manufacturing the wiring board shown in FIG. 1 in accordance with a procedure (No. 19).

Then, in a process shown in FIG. 2S, the solder resist layer 117 having an opening portion 117A from which a part of the pattern wiring 116b is exposed is formed so as to cover the reinforcing layer 114 therewith.

Figure 2T:
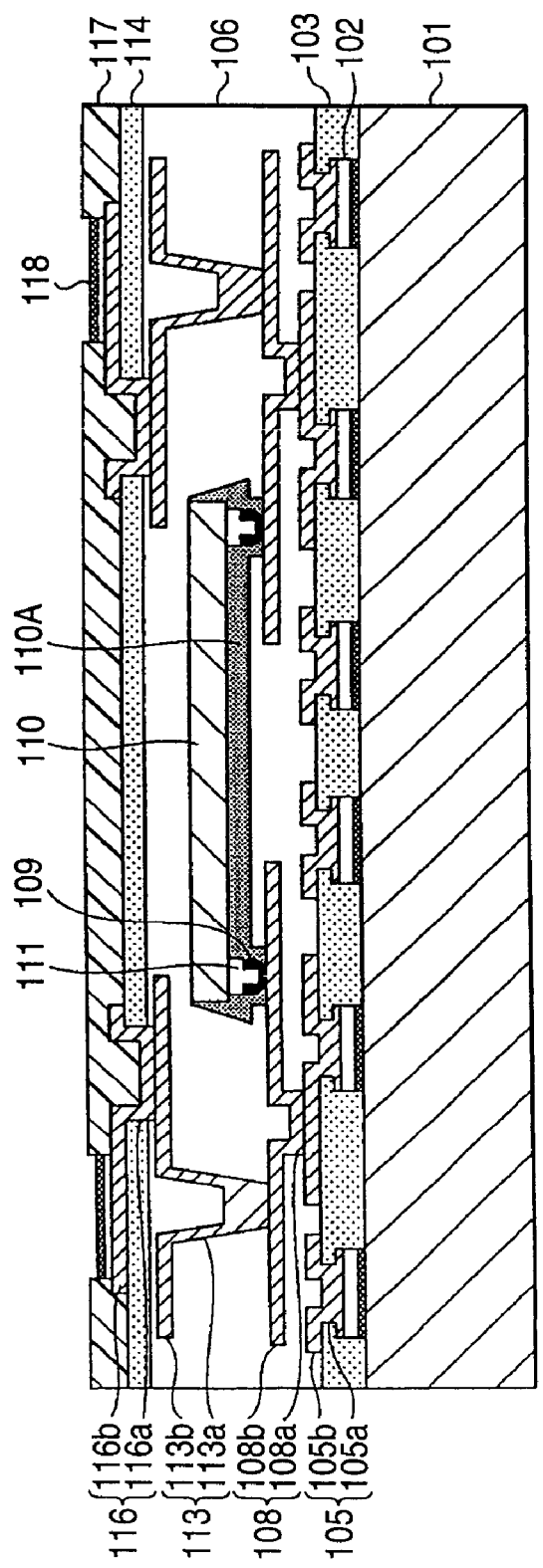
FIG. 2T is a diagram showing the method for manufacturing the wiring board shown in FIG. 1 in accordance with the procedure (No. 20).

Then, in a process shown in FIG. 2T, the electrode 118 made of, for instance, Ni/Au is formed on the pattern wiring 116b exposed from the opening portion 117A.

Figure 2U:
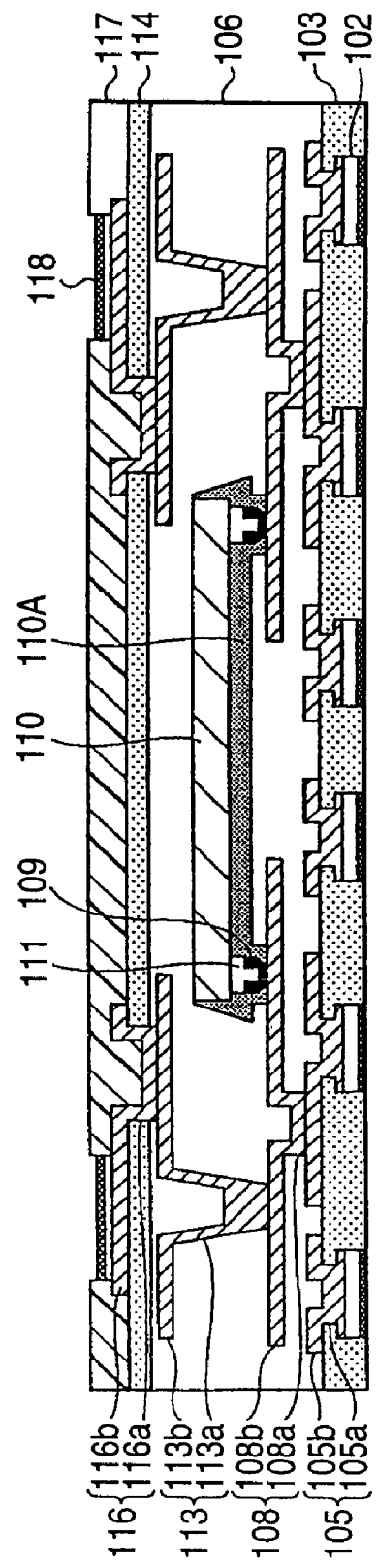
FIG. 2U is a diagram showing the method for manufacturing the wiring board shown in FIG. 1 in accordance with the procedure (No. 21).
Figure 2V:
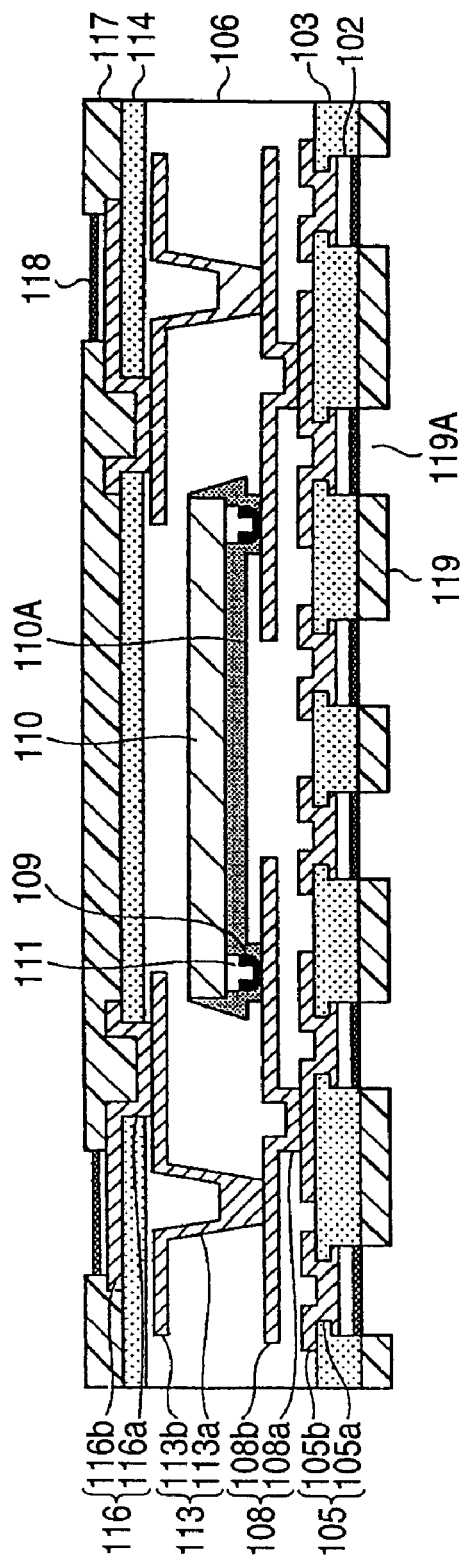
FIG. 2V is a diagram showing a method for manufacturing the wiring board shown in FIG. 1 in accordance with the procedure (No. 22).

Then, in a process shown in FIG. 2U, the supporting board 101 is removed by, for instance, a wet etching process. Then, in a process shown in FIG. 2V, the solder resist layer 119 having an opening portion 119A from which the electrode 102 is exposed is formed so as to cover the reinforcing layer 103 therewith.

After that, the solder ball 120 is formed in the electrode 102, so that the wiring board 100 shown in FIG. 1 can be formed.

Since the usual build-up method is applied to the above-described manufacturing method using a core-less structure (a structure with the supporting board removed), the thin, compact and light wiring board can be realized, and the warpage can be reduced by the reinforcing layers 103 and 114. Accordingly, the wiring board having the finely formed wiring sections and the small thickness can be formed.

Further, the reinforcing layer 103 is preferably formed so as to be thicker than the reinforcing layer 114, because in the processes of manufacturing the wiring board, the number of times of having heat stress is increased more toward the lower layer. For instance, the insulating layer 106 is formed by laminating the thermosetting resin materials. In the above-described embodiment, though a description is omitted, every time the thermosetting resin material is laminated, a thermosetting process is preferably provided. Therefore, since the number of times of having the heat stress is increased in the lower (a lower layer side) reinforcing layer of the wiring board, the lower reinforcing layer is preferably formed to be thicker than the upper (an upper layer side) reinforcing layer to reduce the warpage.

As one example of the thickness of the wiring board 100, for instance, when the thickness of the reinforcing layer 103 is set to 80 μm and the thickness of the reinforcing layer 114 is 40 μm, the wiring board having the entire thickness of 440 μm can be formed.

It is to be understood that the number of laminated wiring is not limited to the number described in the embodiment and may be variously changed and formed.

Furthermore, in this embodiment, the supporting board 101 made of, for example, Cu is removed by etching. However, alternatively, the supporting board 101 may be provided with a release layer on a side to be in contact with the reinforcing layer 103, by preparing the supporting board 101 onto which an adhesive release tape is applied, for example. Preferably, adhesive strength of the release layer lowers by being heated. In this case, in the step of removing the supporting board 101 from the reinforcing layer 103 as shown in FIG. 2U, the reinforcing layer 103 is peeled off from the release layer by heating the entire wiring board with, for instance, an oven.

Second Embodiment

The wiring board described in the first embodiment can be formed in a structure in which the warpage is more reduced as described below.

Figure 3:
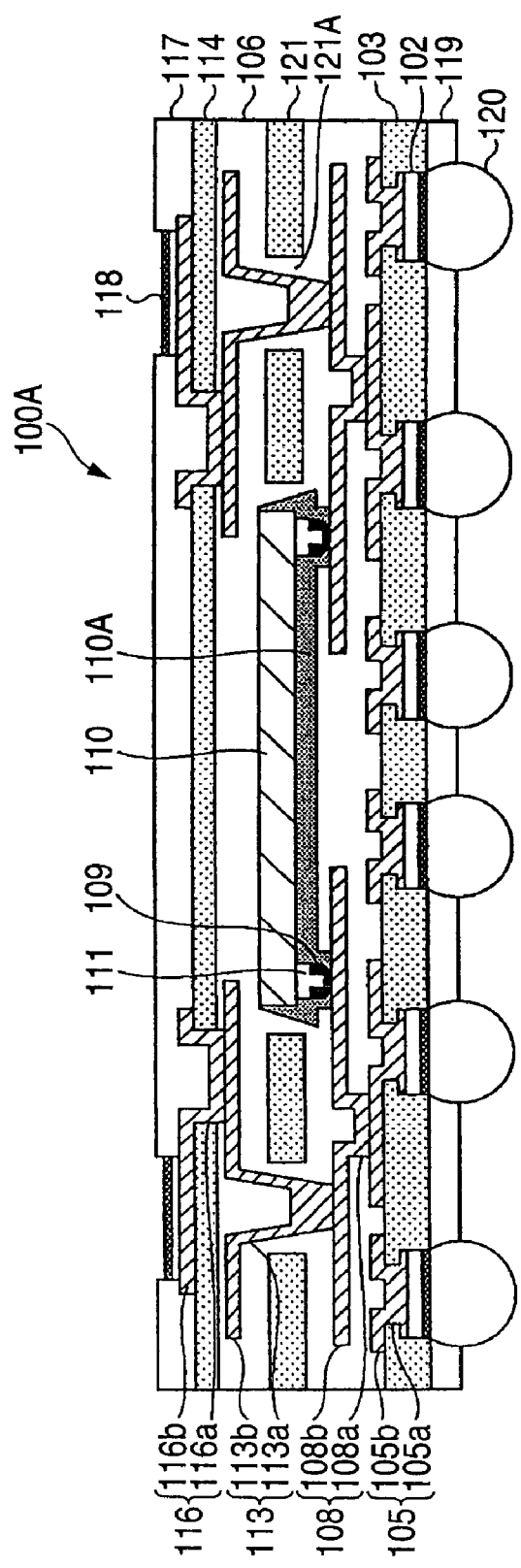
FIG. 3 is a diagram showing a wiring board according to a second embodiment.

FIG. 3 is a sectional view schematically showing a wiring board 100A according to a second embodiment. In the drawing, the previously described parts are designated by the same reference numerals and an explanation thereof is omitted.

Referring to FIG. 3, in the wiring board 100A according to this embodiment, a reinforcing layer 121 that reinforces an insulating layer 106 is embedded in the insulating layer 106 and formed between a reinforcing layer 103 and a reinforcing layer 114.

Further, in the reinforcing layer 121, an opening portion 121A through which a via-plug 113a passes is formed. In such a way, the reinforcing layer is further added to the insulating layer 106 in addition to the structure shown in the first embodiment, so that the rigidity of the wiring board is more improved and an effect for suppressing the warpage of the wiring board is more increased.

Further, when the wiring board 100A according to this embodiment is produced, in the manufacturing method described in the first embodiment, a process for forming the reinforcing layer 121 may be added after the process shown in FIG. 2L. Subsequent processes are the same as those of the first embodiment. Thus, the wiring board 100A can be produced.

Further, the reinforcing layer 121 is made of, for instance, a prepreg material like the reinforcing layers 103 and 114, however, may be formed by using a mold resin or a metal material.

Third Embodiment

In recent years, a problem arises that a semiconductor chip operating at high speed generates large quantity of heat so that a warpage is sometimes generated in a wiring board in which the semiconductor chip is incorporated.

Thus, when a heat radiating section for radiating the heat of the semiconductor chip is added to the wiring board shown in the first embodiment or the second embodiment, the damage of the semiconductor chip or an imperfect operation due to the generated heat is desirably reduced and the warpage of the wiring board due to the generated heat is reduced.

Figure 4:
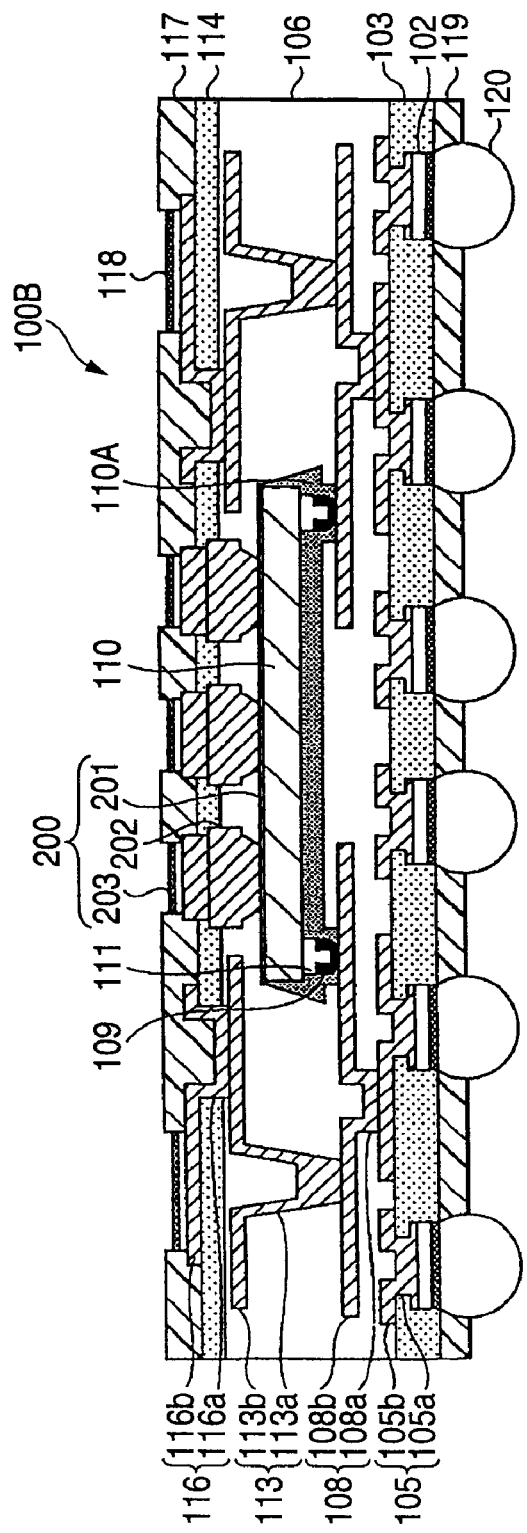
FIG. 4 is a diagram showing a wiring board according to a third embodiment.

FIG. 4 is a sectional view schematically showing a wiring board 100B according to a third embodiment of the present invention. In the drawing, the previously described parts are designated by the same reference numerals and an explanation thereof is omitted.

Referring to FIG. 4, in the wiring board 100B according to this embodiment, a heat radiating section 200 is formed for radiating the heat (cooling) of a semiconductor chip 110. The heat radiating section 200 includes a metal layer 201 formed on the semiconductor chip 110, a heat radiating via-plug 202 connected to the metal layer 201 and formed so as to stand on the metal layer 201 and an electrode 203 formed on the heat radiating via-plug 202 and made of, for instance, Ni/Au.

The metal layer has a structure of Cr/Cu or Ti/Cu and is formed on the back side of a device surface of the semiconductor chip 110. Further, the heat radiating via-plug 202 is made of, for instance, Cu, connected to the metal layer 201 and formed so as to stand on the metal layer 201 and allow its side surfaces to come into contact with an insulating layer 106, a reinforcing layer 114 and a solder resist layer 117.

As described above, since the metal layer 201 and the heat radiating via-plug 202 are formed, the heat generated in the semiconductor chip 110 can be efficiently radiated. Accordingly, the breakage of the semiconductor chip or an imperfect operation or the warpage of the wiring board due to the heat can be effectively suppressed.

Further, the electrode 203 is formed on the heat radiating via-plug 202 exposed from an opening portion formed in the solder resist layer 117. For instance, on the electrode 203, a solder ball is formed as required. Thus, the electrode can be connected to an object to be connected to the wiring board such as a mother board. For instance, when the heat radiating via-plug 202 is connected to the object to be connected through the electrode 203, the heat is more efficiently radiated to efficiently expel the heat generated in the semiconductor chip to the object to be connected.

Now, a method for manufacturing the wiring board 100B will be described in accordance with a procedure with reference to FIGS. 5A to 5J. In the drawings, the previously described parts are designated by the same reference numerals and an explanation thereof will be omitted. Parts that are not explained are the same as those of the first embodiment.

Figure 5A:
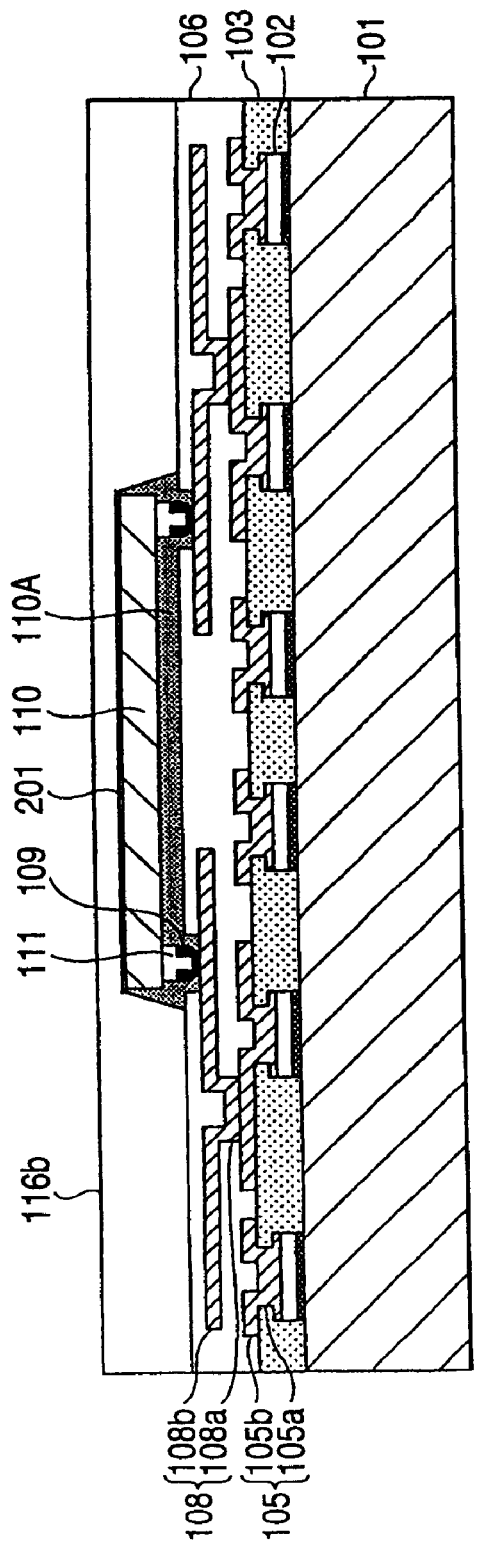
FIG. 5A is a diagram showing a method for manufacturing the wiring board shown in FIG. 4 in accordance with a procedure (No. 1).

A process shown in FIG. 5A corresponds to the process shown in FIG. 2M of the manufacturing method described in the first embodiment. That is, the processes shown in FIGS. 2A to 2M of the first embodiment are carried out to obtain a state shown in FIG. 5A. However, in this embodiment, before the semiconductor chip 110 is mounted on a wiring section, the metal layer 201 having the structure made of, for instance, Cr/Cu or Ti/Cu is formed on the back side of the device forming surface of the semiconductor chip 110 by a sputtering method.

Figure 5B:
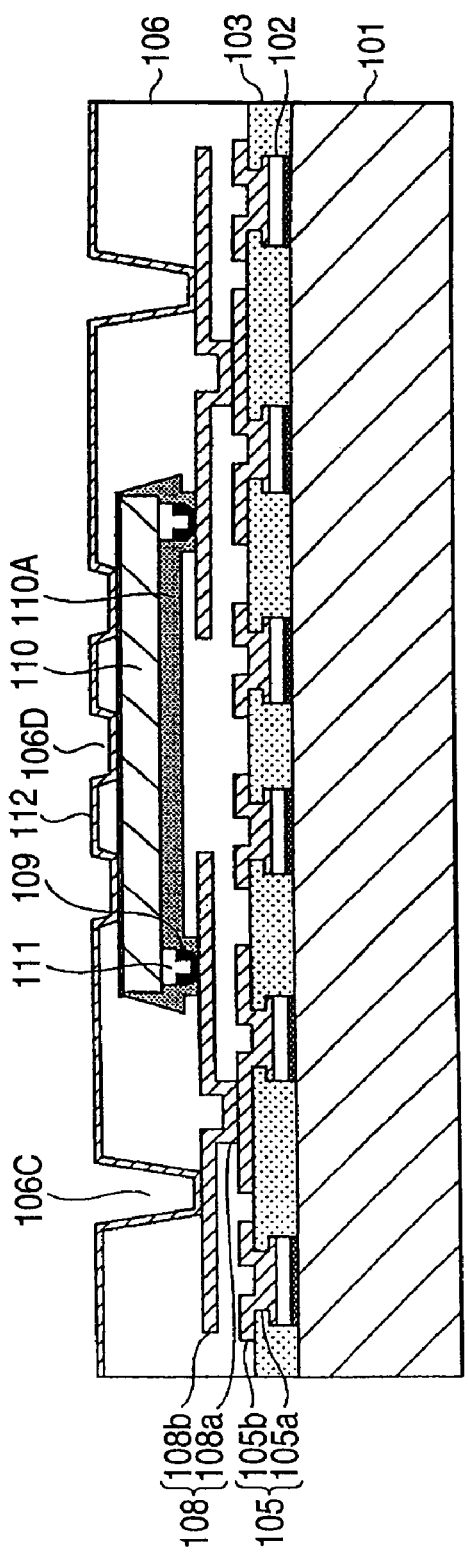
FIG. 5B is a diagram showing the method for manufacturing the wiring board shown in FIG. 4 in accordance with the procedure (No. 2).

Then, in a process shown in FIG. 5B (a process corresponding to the process shown in FIG. 2N of the first embodiment), a via-hole 106C is formed on the insulating layer 106 and a via-hole 106D reaching the metal layer 201 is formed by, for instance, a laser.

In this case, the metal layer functions as the stopper layer of the laser to prevent the device formed on the semiconductor chip from being damaged by the laser. That is, the metal layer 201 contributes to the heat radiation and serves as a protecting layer of the device of the semiconductor chip in the processes for manufacturing the wiring board. Further, the metal layer effectively improves the adhesive force between a heat radiating via-plug formed in the via-hole in a subsequent process and the semiconductor chip.

Then, a desmear process is carried out as required to remove the residue materials of the via-holes and perform a surface treatment of the insulating layer 106. Then, a seed layer 112 of Cu is formed on the surface of the insulating layer 106 including the inner wall surfaces of the via-holes, the surface of a pattern wiring 108*b*, and the surface of the metal layer 201 by an electroless plating process.

Then, in a process shown in FIG. 5C (a process corresponding to the process shown in FIG. 2O of the first embodiment), a wiring section 113 is formed and a heat-radiating via plug 202A is formed in the via-hole 106D.

In a process shown in FIG. 5D (a process corresponding to the process shown in FIG. 2P of the first embodiment), an insulating layer 106*c* is formed in the same manner as that of the first embodiment to form the reinforcing layer 114 made of, for instance, prepreg material on the insulating layer 106*c*. Further, a via-hole 114A is formed and a via-hole 114B is formed on the prepreg material 114 by, for instance, a laser.

Then, in a process shown in FIG. 5E (a process corresponding to the process shown in FIG. 2Q of the first embodiment), a desmear process is carried out if necessary to remove the residue materials of the via-holes and perform the surface treatments of the insulating layer 106 and the reinforcing layer 114. Then, a seed layer 115 of Cu is formed on the inner wall surfaces of the via-holes 114A and 114B, the surface of the reinforcing layer 114, the surface of a pattern wiring 113*b* and the surface of the heat radiating via-plug 202A.

Figure 5F:
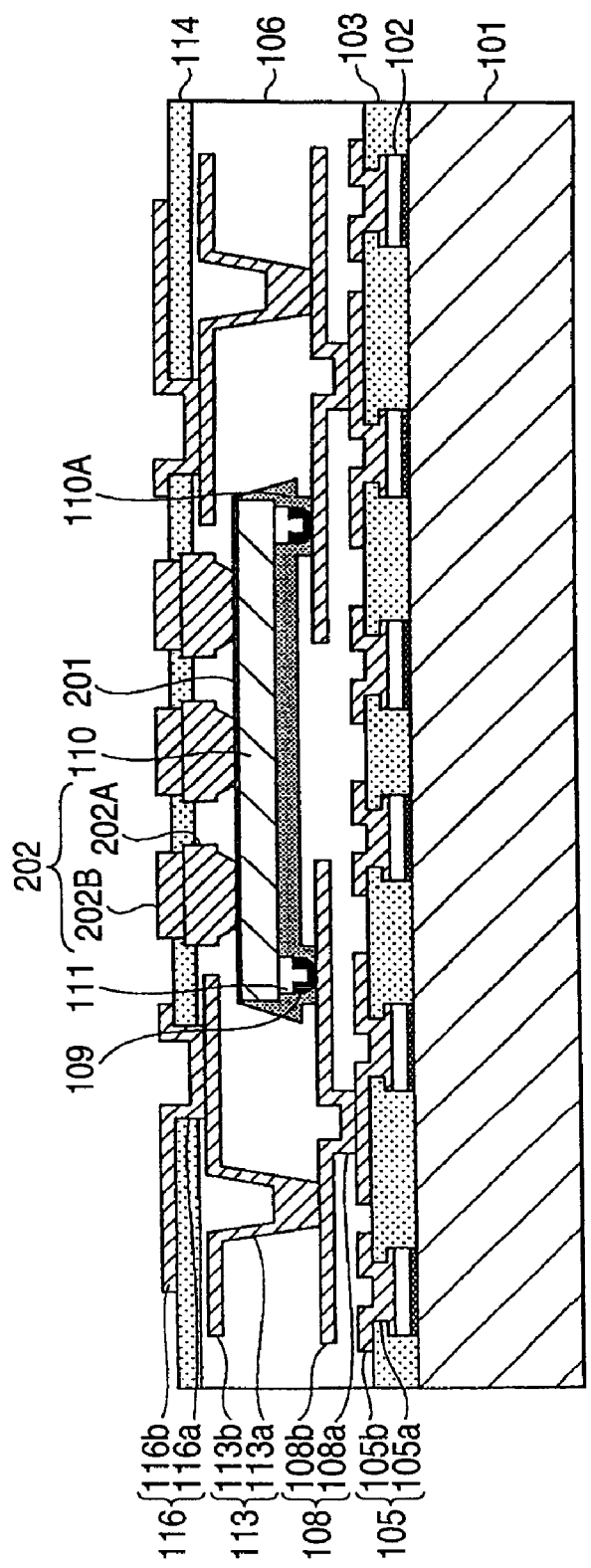
FIG. 5F is a diagram showing the method for manufacturing the wiring board shown in FIG. 4 in accordance with the procedure (No. 6).

Then, in a process shown in FIG. 5F (a process corresponding to the process shown in FIG. 2R of the first embodiment), a wiring section 116 is formed by an electrolytic plating process of Cu and a heat radiating via-plug 202B is formed so as to be laminated on the heat-radiating via-plug 202A. Thus, the heat radiating via-plug 202 including the heat radiating via-plugs 202A and 202B is formed.

After the wiring section 116 and the heat radiating via-plug 202 are formed, a resist pattern is peeled to remove the exposed surplus seed layer by an etching process.

In subsequent processes shown in FIGS. 5G to 5J, processes corresponding to FIGS. 2S to 2V of the first embodiment are carried out so that the wiring board 100B can be formed.

Figure 5G:
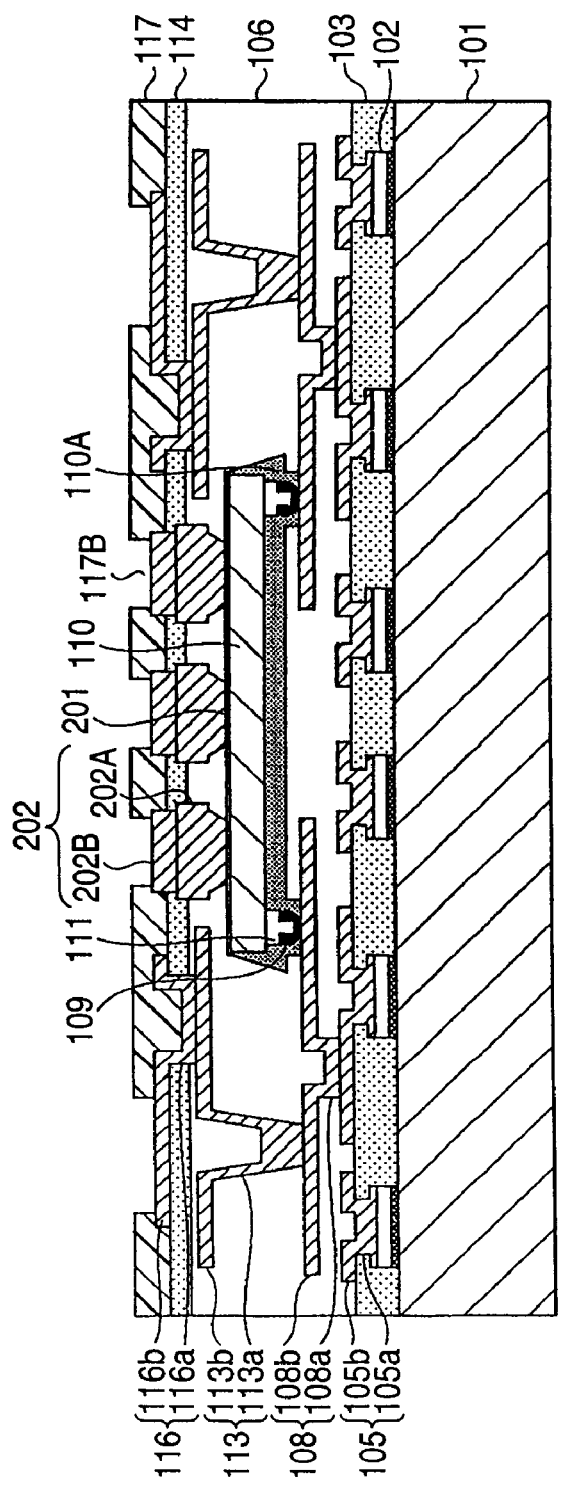
FIG. 5G is a diagram showing the method for manufacturing the wiring board shown in FIG. 4 in accordance with the procedure (No. 7).
Figure 5I:
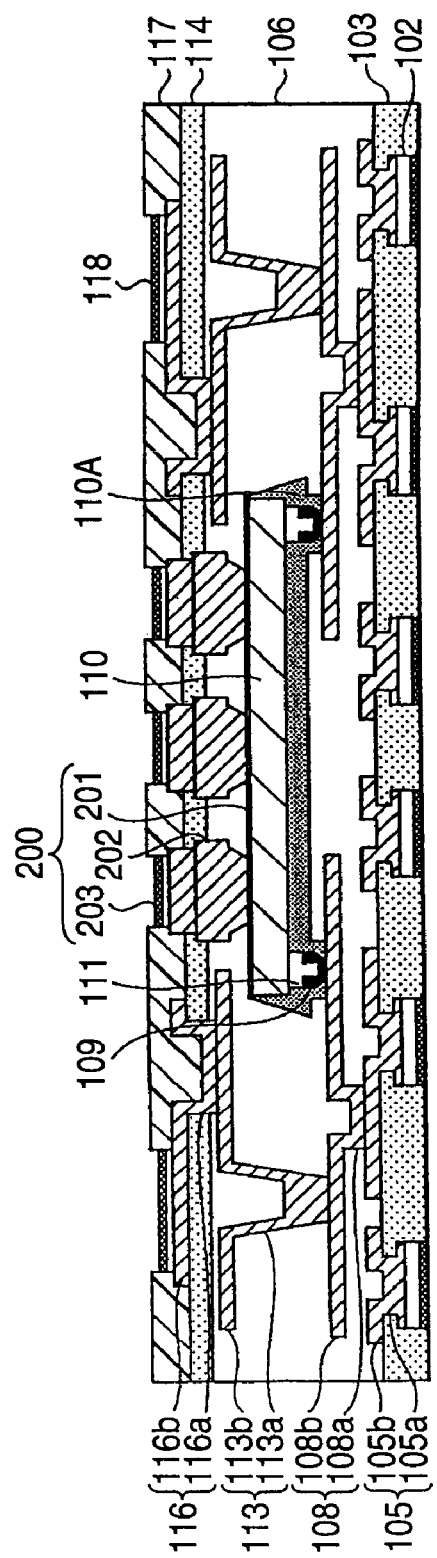
FIG. 5I is a diagram showing the method for manufacturing the wiring board shown in FIG. 4 in accordance with the procedure (No. 9).
Figure 5J:
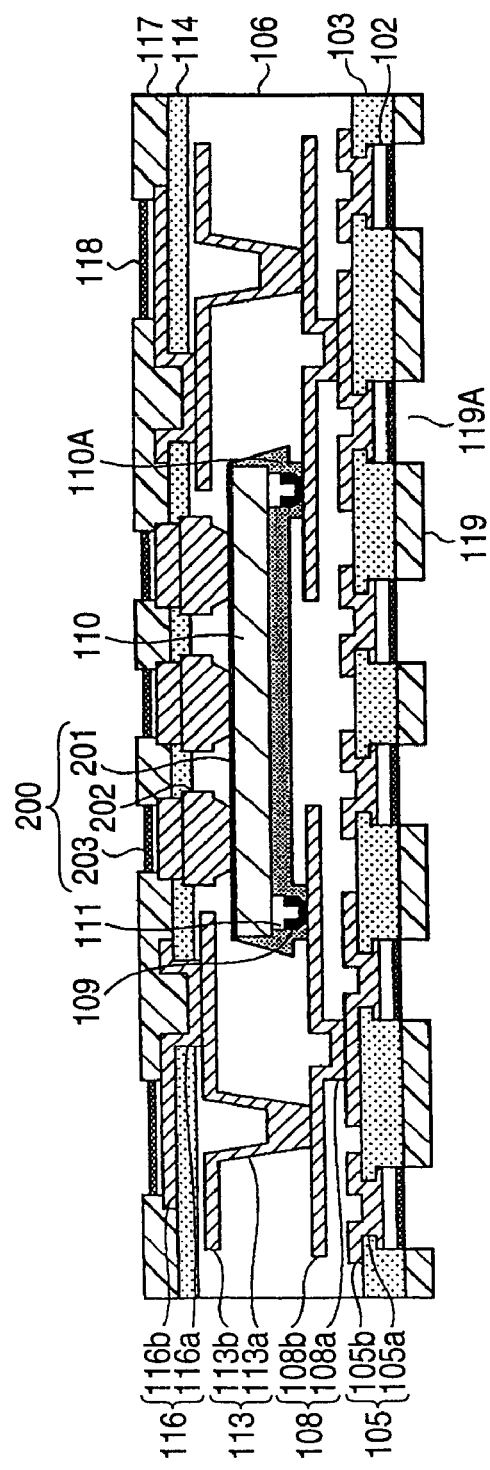
FIG. 5J is a diagram showing the method for manufacturing the wiring board shown in FIG. 4 in accordance with the procedure (No. 10).

In this embodiment, the wiring board can be formed in the same manner as that of the first embodiment except that in a process shown in FIG. 5G, an opening portion 117B is formed from which the heat radiating via-plug 202 is exposed is formed on the solder resist layer 117, and in a process shown in FIG. 5H, when an electrode 118 is formed, the electrode 203 is formed on the heat radiating via plug 202.

In the manufacturing method according to this embodiment, the heat radiating section of the semiconductor chip can be formed without increasing the number of processes as compared with the manufacturing method of the first embodiment.

Further, it is to be understood that the structure of the heat radiating section is not limited to this embodiment, and, for instance, materials thereof (kinds of metal materials) or structures thereof (the number of heat radiating via-plugs, positions thereof, etc.) may be variously modified and changed.

The preferred embodiments are described above, however, the present invention is not limited to the above-described specific embodiments, and various modifications and changes can be made within a scope of the gist of claims.

According to the present invention, the small thickness of a wiring board in which a semiconductor chip is incorporated can be realized and the warpage of the wiring board can be suppressed.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A wiring board comprising:
    a semiconductor chip;
    an insulating layer in which the semiconductor chip is embedded;
    a wiring connected to the semiconductor chip; and
    reinforcing layers for reinforcing the insulating layer, the reinforcing layers respectively formed on a front face side of the insulating layer and a rear face side of the insulating layer and being spaced away the semiconductor chip by said insulating layer,
    wherein the semiconductor chip is embedded in the insulating layer such that the insulating layer surrounds and is directly on exposed surfaces of the semiconductor chip.

2. The wiring board according to claim 1, wherein the reinforcing layers are made of prepreg material.

3. The wiring board according to claim 1, wherein one reinforcing layer of the reinforcing layers which is formed on the rear face side of the insulating layer has an opening portion, and an electrode to be connected to the wiring is formed in the opening portion.

4. The wiring board according to claim 1, wherein an electrode to be connected to the wiring is formed above the other reinforcing layer of the reinforcing layers that is formed on the front face side of the insulating layer.

5. The wiring board according to claim 1, further comprising: an additional reinforcing layer for reinforcing the insulating layer, the additional reinforcing layer being embedded in the insulating layer.

6. The wiring board according to claim 1, further comprising: a heat radiating section for radiating heat of the semiconductor chip.

7. The wiring board according to claim 6, wherein the heat radiating section includes a metal layer formed on the semiconductor chip and a heat radiating via-plug connected to the metal layer.

8. The wiring board according to claim 1, wherein one reinforcing layer of the reinforcing layers which is formed on the back face side of the insulating layer is formed thicker than other reinforcing layer of the reinforcing layers which is formed on the front face side of the insulating layer.

9. A method for manufacturing a wiring board, the method comprising:
   forming a first reinforcing layer on a supporting board, the first reinforcing layer reinforcing an insulating layer;
   forming the insulating layer and a wiring on the first reinforcing layer, a semiconductor chip being embedded in the insulating layer such that the insulating layer surrounds and is directly on exposed surfaces of the semiconductor chip, the wiring being connected to the semiconductor chip;
   forming a second reinforcing layer on the insulating layer, the second reinforcing layer reinforcing the insulating layer; and
   removing the supporting board,
   wherein the first reinforcing layer and the second reinforcing layer are spaced away from the semiconductor chip by the insulating layer.

10. The method for manufacturing the wiring board according to claim 9, further comprising: forming a third reinforcing layer to be embedded in the insulating layer, the third reinforcing layer reinforcing the insulating layer.

11. The method for manufacturing the wiring board according to claim 9, further comprising: forming a heat radiating section on the semiconductor chip, the heat radiating section radiating heat of the semiconductor chip.

12. The method for manufacturing the wiring board according to claim 9, wherein the first reinforcing layer is formed thicker than the second reinforcing layer.

* * * * *